United States Patent
Yamazaki et al.

(10) Patent No.: US 7,473,575 B2
(45) Date of Patent: Jan. 6, 2009

(54) LIGHT EMITTING DEVICE

(75) Inventors: Hiroko Yamazaki, Kanagawa (JP); Atsushi Tokuda, Kanagawa (JP); Tetsuo Tsutsui, Fukuoka (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 10/737,569

(22) Filed: Dec. 16, 2003

(65) Prior Publication Data

US 2004/0124425 A1  Jul. 1, 2004

Related U.S. Application Data

(63) Continuation of application No. 10/304,410, filed on Nov. 26, 2002, now Pat. No. 6,734,457.

(30) Foreign Application Priority Data

Nov. 27, 2001  (JP)  ............................. 2001-360500

(51) Int. Cl.
   *H01L 51/40* (2006.01)
(52) U.S. Cl. .................... 438/99; 257/40; 250/304; 428/690; 428/917
(58) Field of Classification Search ............. 438/99; 257/40; 250/304; 428/690, 917
   See application file for complete search history.

(56) References Cited

U.S. PATENT DOCUMENTS 5,601,903 A    2/1997   Fujii et al.
5,756,224 A    5/1998   Borner et al.
5,935,720 A    8/1999   Chen et al.

(Continued)

FOREIGN PATENT DOCUMENTS

EP    0 517 542 B1    8/1995

(Continued)

OTHER PUBLICATIONS

Z.Y. Xie, J. Feng et al., "Tuning of chromaticity in organic multiple-quantum well white light emitting devices" 2000, Synthetic Metals 108( 2000) pp. 81-84 ( copy enclosed).*

(Continued)

*Primary Examiner*—Howard Weiss
*Assistant Examiner*—Shrinivas H. Rao
(74) *Attorney, Agent, or Firm*—Eric J. Robinson; Robinson Intellectual Property Law Office, P.C.

(57) ABSTRACT

A triplet light emitting device which has high efficiency and improved stability and which can be fabricated by a simpler process is provided by simplifying the device structure and avoiding use of an unstable material. In a multilayer device structure using no hole blocking layer conventionally used in a triplet light emitting device, that is, a device structure in which on a substrate, there are formed an anode, a hole transporting layer constituted by a hole transporting material, an electron transporting and light emitting layer constituted by an electron transporting material and a dopant capable of triplet light emission, and a cathode, which are laminated in the stated order, the combination of the hole transporting material and the electron transporting material and the combination of the electron transporting material and the dopant material are optimized.

24 Claims, 11 Drawing Sheets

U.S. PATENT DOCUMENTS

| | | | |
|---|---|---|---|
| 5,998,803 | A | 12/1999 | Forrest et al. |
| 6,048,630 | A | 4/2000 | Burrows et al. |
| 6,097,147 | A | 8/2000 | Baldo et al. ................. 313/506 |
| 6,303,238 | B1* | 10/2001 | Thompson et al. .......... 428/690 |
| 6,358,631 | B1* | 3/2002 | Forrest et al. ............... 428/690 |
| 6,396,209 | B1 | 5/2002 | Kido et al. |
| 6,433,355 | B1* | 8/2002 | Riess et al. ................... 257/40 |
| 6,468,676 | B1 | 10/2002 | Ueda et al. |
| 6,573,651 | B2* | 6/2003 | Adachi et al. ............... 313/504 |
| 6,579,632 | B2 | 6/2003 | Thompson et al. |
| 6,593,690 | B1* | 7/2003 | McCormick et al. ........ 313/506 |
| 6,784,016 | B2* | 8/2004 | Long et al. .................... 438/99 |
| 6,809,473 | B2 | 10/2004 | Ueda et al. |
| 6,830,828 | B2 | 12/2004 | Thompson et al. .......... 428/690 |
| 6,872,477 | B2 | 3/2005 | Thompson et al. |
| 6,902,830 | B2 | 6/2005 | Thompson et al. .......... 428/690 |
| 2002/0028329 | A1 | 3/2002 | Ise et al. ...................... 428/336 |
| 2002/0034656 | A1 | 3/2002 | Thompson et al. .......... 428/690 |
| 2003/0017361 | A1 | 1/2003 | Thompson et al. .......... 428/690 |
| 2004/0262576 | A1 | 12/2004 | Thompson et al. ..... 252/301.16 |

FOREIGN PATENT DOCUMENTS

| | | |
|---|---|---|
| EP | 1 175 128 | 1/2002 |
| JP | 05-339565 | 12/1993 |
| JP | 06-203963 | 7/1994 |
| JP | 07-065958 | 3/1995 |
| JP | 2000-082582 | 3/2000 |
| JP | 2000-182774 | 6/2000 |
| JP | 2000-223280 | 8/2000 |
| JP | 2001-006878 | 1/2001 |
| JP | 2002-100476 | 4/2002 |
| WO | WO 99/20081 | 4/1999 |
| WO | WO 00/16593 A1 | 3/2000 |
| WO | WO 2000/016593 | 3/2000 |
| WO | WO 01/41512 A1 | 6/2000 |
| WO | WO 00/57676 | 9/2000 |
| WO | WO 00/70655 A2 | 11/2000 |

OTHER PUBLICATIONS

Dr. Gaetano Di Marco et al. , "A luminescent iridium ( III) cyclometallateed complex immobilized in a polymeric matrix as a solid-state oxygen sensor" ( 1996) Advanced Materials 8, No. 7 pp. 576-580.*

Tang, C.W. et al, 'Organic Electroluminescent Diodes,' Applied Physics Letters, vol. 51, No. 12, pp. 913-915, Sep. 21, (1987).

Adachi, C. et al, 'Electroluminescence in Organic Films with Three-Layered Structure,' Japanese Journal of Applied Physics, vol. 27, No. 2, pp. L269-L271, Feb. 1988.

Tang, C.W. et al, 'Electroluminescence of Doped Organic Thin Films,' Journal of Applied Physics, vol. 65, No. 9, May 1, 1989.

Baldo, M.A. et al, 'Highly Efficient Phosphorescent Emission from Organic Electroluminescent Devices,' Nature, vol. 395, pp. 151-154, Sep. 10, 1998.

O'Brien, D.F., et al, "Improved Energy Transfer in Electrophosphorescent Devices," Applied Physics Letters, vol. 74, No. 3, pp. 442-444, Jan. 19, 1999.

Baldo, M.A. et al, "Very High-Efficiency Green Organic Light-Emitting Devices Based on Electrophosphorescence," Applied Physics Letters, vol. 75, No. 1, pp. 4-6, Jul. 5, 1999.

Tsutsui, T. et al, "High Quantum Efficiency in Organic Light-Emitting Devices with Iridium-Complex as a Triplet Emissive Center,"Japanese Journal of Applied Physics, vol. 38, part 2, No. 12B, pp. L 1502- L 1504, Dec. 15, 1999.

Adachi, C. et al, 'High-Efficiency Organic Electrophosphorescent Devices with Tris (2-phenylpyridine) iridium Doped into Electron-Transporting Materials,' Applied Physics Letters, vol. 77, No. 6, pp. 904-906, Aug. 7, 2000.

Watanabe, T. et al, 'Optimization of Emitting Efficiency in Organic LED Cells Using Ir Complex,' Synthetic Metals, vol. 122, pp. 203-207, (2001).

Adachi, C. et al, 'Efficient Electrophosphorescence Using a Doped Ambipolar Conductive Molecular Organic Thin Film,' Organic Electronics vol. 2, pp. 37-43, (2001).

Kido et al, "Bright, White-Light-Emitting Organic EL Device," 46th Applied Physics Relation Union Lecture Meeting, Japan Society of Applied Physics and related Societies, Extended Abstracts, 28a-ZD-25, No. 3, pp. 1281 (1999); with partial English translation.

Kijima, Y. et al. "A Blue Organic Light Emitting Diode," Jpn. J. Appl. Phys., vol. 38, part 1, No. 9A, pp. 5274-5277, Sep. 1999.

Adachi, C. et al, "Endothermic Energy Transfer: A Mechanism for Generating Very Efficient High-Energy Phosphorescent Emission in Organic Materials," Applied Physics Letters, vol. 79, No. 13, pp. 2082-2084, Sep. 24, 2001.

Baldo, M.A. et al., "Phosphorescent Materials for Application to Organic Light Emitting Devices," Pure and Applied Chemistry, vol. 71, pp. 2095-2106, (1999).

Burrows, P.E. et al, "Operating Lifetime of Phosphorescent Organic Light Emitting Devices," Applied Physics Letters, vol. 76, pp. 2493-2495, (2000).

Adachi, C. et al, "High-Efficiency Red Electrophosphorescence Devices," Applied Physics Letters, vol. 78, pp. 1622-1624 (2001).

Thompson, M.E. et al, "High Efficiency Organic Electrophosphorescent Devices," Proceedings of SPIE—The International Society for Optical Engineering, vol. 4105, pp. 119-124, (2001).

Adachi, C. et al, "Nearly 100% Internal Phosphorescence Efficiency in an Organic Light Emitting Devices," Journal of Applied Physics, vol. 90, pp. 5048-5051, (Nov. 15, 2001).

Ikai, M. et al, "Approaches to Advanced Organic Light Emitting Diodes: Materials and Devices," Mat. Res. Soc. Symp. Proc., vol. 665, C4.3, pp. 81-91, (2001).

Ikai, M. et al, "Highly Efficient Phosphorescence from Organic Light-Emitting Devices with an Exciton-Block Layer," Applied Physics Letters, vol. 79, No. 2, pp. 156-158, (2001).

Ogawa, H. et al, "Tuning of the Emission Color of Organic Electroluminescent Devices by Exciplex Formation at the Organic Solid Interface," Applied Physics A: Materials Science & Processing, vol. 67, No. 5, pp. 599-602, (1998).

Shirota, Y., "Organic Light-Emitting Diodes Using Novel Charge-Transport Materials," Proceedings of SPIE—The International Society for Optical Engineering, vol. 3148, pp. 186-193, (1997).

Ogawa, H. et al, "Thermally Stable Organic Electroluminescent Device Using Novel Amorphous Molecular Charge-Transport Materials, 4,4',4"-tris[bis(4'-tert-butyl-biphenyl-4-yl)amino] triphenylamine and 4,4'4"-tri(N-carbazolyl) triphenylamine," Macromolecular Symposia, vol. 125, pp. 171-180, (1997).

Shirota, Y. et al, "Starburst Molecules Based on p-electron Systems as Materials for Organic Electroluminescent Devices," Journal of Luminescence, vol. 72-74, pp. 985-991, (1997).

Adachi, C. et al, "Molecular Design of Hole Transport Materials for Obtaining High Durability in Organic Electroluminescent Diodes," Applied Physics Letters, vol. 66, No. 20, pp. 2679-2681, (1995).

Ritchie, R.J. et al, "Crystal and Molecular Structure of 1-Hydrido-1-isopropyltetrachlorocyclotriphosphazene," Inorganic Chemistry, vol. 19, pp. 2853-2855, (1980).

Abkowitz, M.A. et al, "Chemical Modification of Charge Transport in Silicon Backbone Polymers," Synthetic Metals, vol. 28, pp. 553-558, (1989).

Kuwabara, Y. et al, "Thermally Stable Multilayered Organic Electroluminescent Devices Using Novel Starburst Molecules, 4,4',4"-Tri (N-carbazolyl) triphenylamine (TCTA) and 4,4',4"-Tris(3-methylphenylphenyl-amino)triphenylamine (m-MTDATA) , as Hole-Transport Materials," Advanced Materials, vol. 6, No. 9, pp. 677-679 (1994).

Kanai, H. et al, "Effect of Aromatic Diamines as a Cathode Interface Layer," Synthetic Metals, vol. 91, pp. 195-196, (1997).

O'Brien, D.F. et al, "Improved Energy Transfer in Electrophosphorescent Devices," Applied Physics Letters, vol. 74, No. 3, pp. 442-444, (1999).

Djurovich, P.I. et al, "Ir(III)Cyclometalated Complexes as Efficient Phosphorescent Emitters in Polymer Blend and Organic LEDs," Polymer Preprints, vol. 41, pp. 770-771, (2000).

Hill, I.G. et al, "Determination of the Energy Levels of a Phosphorescent Guest in Organic Light Emitting Devices," Applied Physics Letters, vol. 77, pp. 2003-2005, (2000).

Yang, M.J. et al, "Use of Poly(9-vinylcarbazole) as Host Material for Iridium Complexes in High-Efficiency Organic Light-Emitting Devices," Japanese Journal of Applied Physics, vol. 39, pp. L828-L829, (2000).

Lamansky, S. et al, "Highly Phosphorescent Bis-Cyclometalated Iridium Complexes: Synthesis, Photophysical Characterization, and Use in Organic Light Emitting Diodes," Jounral of the American Chemical Society, vol. 123, pp. 4304-4312, (2001).

Gross, E.M. et al, "Electrogenerated Chemiluminescence from Phosphrescent Molecules Used in Organic Light-Emitting Diodes," Journal of the Electrochemical Society, vol. 149, pp. E137-E142, (2002).

Chu, B. et al, "Organic-Film Photovoltaic Cell with Electroluminescence," Applied Physics Letters, vol. 81, pp. 10-12, (2002).

Kolosov, D. et al, "1,8-Naphthalimides in Phosphorescent Organic LEDs: The Interplay Between Dopant, Exciplex, and Host Emission," JACS, vol. 124, pp. 9945-9954, (2002).

Makinen, A.J. et al, "Vacuum Level Alignment in Organic Guest-Host Systems," Journal of Applied Physics, vol. 92, pp. 1598-1603, (2002).

Adamovich, V.I. et al, "New Charge-Carrier Blocking Materials for High Efficiency OLEDs," Organic Electronics, vol. 4, pp. 77-87, (2003).

Holmes, R.J. et al, "Efficient, Deep-Blue Organic Electrophosphorescence by Guest Charge Trapping," Applied Physics Letters, vol. 83, No. 18, pp. 3818-3820, (2003).

D'Andrade, B.W. et al, "Efficient Organic Electrophosphorescent White-Light-Emitting Device with a Triple Doped Emissive Layer," Advanced Materials, vol. 16, No. 7, pp. 624-628, (2004).

D'Andrade, B.W. et al, "Relationship Between the Ionization and Oxidation Potentials of Molecular Organic Semiconductors," Organic Electronics: Physics, Materials, Applications, vol. 6, No. 1, pp. 11-20, (2005).

Losio, P.A. et al, "Singlet Excimer Electroluminescence Within N,N'-di-1-naphthalenyl-N,N'-diphenyl[1,1'-biphenyl]-4,4'-diamine Based Diodes," Applied Physics Letters, vol. 89, pp. 041914-1-3, (2006).

Brooks, J.J., Published PhD Thesis: "New Charge Carriers and Platinum Based Phosphors for Organic Light Emitting Devices," University of Southern California, (2003).

Imahori, H. et al, "Substituent Effects of Porphyrin Monolayers on the Structure and Photoelectrochemical Properties of Self-Assembled Monolayers of Porphyrin on Indium-Tin Oxide Electrode," J. Phys. Chem. B, vol. 108, pp. 5018-5025, (2004).

Narayana Rao, D. et al, "Tetratolylporphyrins as Optical Limiters," School of Physics, University of Hyderabad, Hyderabad, pp. 1-21, (2004).

Chen, C.H. et al, "Recent Developments in Molecular Organic Electroluminescent Materials," Macromol. Symp., vol. 125, pp. 1-48, (1997).

Fujikawa, H. et al, "Energy Structures of Triphenylamine Oligomers," Synthetic Metals, vol. 91, pp. 161-162, (1997).

Giro, G. et al, "Multicomponent Emission from Organic Light Emitting Diodes Based on Polymer Dispersion of an Aromatic Diamine and an Oxadiazole Derivative," Chemical Physics Letters, vol. 318, pp. 137-141, (2000).

Lee, J.K. et al, "Thin Film Light Emitting Devices from an Electroluminescent Ruthenium Complex," vol. 69, No. 12, pp. 1686-1688, (1996).

Lin, C.T. et al, "Mechanism of the Quenching of the Emission of Substituted Polypyridineruthenium(II) Complexes by Iron(III), Chroium(III), and Europium(III) Ions," Journal of the American Chemical Society, vol. 98, No. 21, pp. 6536-6544, (1976).

Y. Noh, et al., *Energy Transfer and Device Performance in Phosphorescent Dye Doped Polymer Light Emitting Diodes*, Journal of Chemical Physics, vol. 118, No. 6, pp. 2853-2864, Feb. 8, 2003.

Declaration of Ching W. Tang, Ph.D., Oct. 17, 2006.

Declaration of Daniel Nocera, Ph.D., Oct. 17, 2006.

Second Declaration of Ching W. Tang, Ph.D., Dec. 5, 2006.

Castellan, Gilbert W., "Photophysical Processes: Fluorescence and Phosphorescence," Physical Chemistry 3rd Edition, Addision-Wesley Publishing Company, Inc., Reading, MA (1983) pp. 891-896.

Atkins, P.W., "The Fate of Electronically Excited States," Physical Chemistry 3rd Edition, Oxford Unversity Press, Oxford, UK, 1987, pp. 471-472.

Eastwood, D. et al., "Porphyrins: XVIII. Luminescence of (Co), (Ni), Pd, Pt Complexes," Journal of Molecular Spectroscopy, vol. 35, Issue 3, Sep. 1970, pp. 359-375.

Vinogradov, S. et al., "Metallotetrabenzoporphyrins. New Phosphrescent Probes for Oxygen Measurements," Journal of the Chemical Society, Perkin Transactions 2, Issue 1, 1995, pp. 103-111.

Gouterman, M. et al., "Porphyrins. XXXI. Chemical Properties and Electronic Spectra of $d^0$ Transition-Metal Complexes," J. Am. Chem. Soc., vol. 97, No. 11, May 28, 1975, pp. 3142-3149.

Gouterman, M., "Optical Spectra and Electronic Structure of Porphyrins and Related Rings" The Porphyrins vol. III, Physical Chemistry, Part A, David Dolphin (ed)., Academic Press, New York, 1978, pp. 1-165.

Johnson, Curtis E. et al., "Luminescent Iridium(I), Rhodium(I), and Platinum (II) Dithiolate Complexes," J. Am. Chem. Soc., 1983, 105, No. 7, pp. 1795-1802.

Baldo, M.A., et al., "Phosphorescent Materials for Application to Organic Light Emitting Devices," Pure and Applied Chemistry, vol. 71, No. 11, 1999, pp. 2095-2106.

Burrows, P.E., et al., "Operating Lifetime of Phosphorescent Organic Light Emitting Devices," Applied Physics Letters, vol. 76, No. 18, 2000, pp. 2493-2495.

Adachi, C., et al., "High-Efficiency Red Electrophosphorescence Devices," Applied Physics Letters, vol. 78, No. 11, 2001, pp. 1622-1624.

Adachi, C., et al., "Nearly 100% Internal Phosphorescence Efficiency in an Organic Light Emitting Device," Journal of Applied Physics, vol. 90, No. 10, Nov. 15, 2001, pp. 5048-5051.

Ritchie, R.J. et al., "Crystal and Molecular Structure of 1-Hydrido-1-isopropyltetrachlorocyclotriphosphazene," Inorganic Chemistry, vol. 19, No. 9, 1980, pp. 2853-2855.

Abkowitz, M.A., et al., "Chemical Modification of Charge Transport in Silicon Backbone Polymers," Synthetic Metals, vol. 28, Nos. 1 and 2, 1989, pp. 553-558.

Djurovich, P.I. et al., "Ir(III) Cyclometalated Complexes as Efficient Phosphorescent Emitters in Polymer Blend and Organic LEDs," Polymer Preprints, vol. 41, No. 1, 2000, pp. 770-771.

Hill, I.G., et al., "Determination of the Energy Levels of a Phosphorescent Guest in Organic Light Emitting Devices," Applied Physics Letters, vol. 77, No. 13, 2000, pp. 2003-2005.

Yang, M.J., et al., "Use of Poly(9-vinylcarbazole) as Host Material for Iridium Complexes in High-Efficiency Organic Light-Emitting Devices," Japanese Journal of Applied Physics, vol. 39, No. 8A, 2000, pp. L828-L829.

Lamansky, S., et al., "Highly Phosphorescent Bis-Cyclometalated Iridium Complexes: Synthesis, Photophysical Characterization, and Use in Organic Light Emitting Diodes," Journal of the American Chemical Society, vol. 123, No. 18, 2001, pp. 4304-4312.

Gross, E.M., et al., "Electrogenerated Chemiluminescence from Phosphorescent Molecules Used in Organic Light-Emitting Diodes," Journal of the Electrochemical Society, vol. 149, No. 5, 2002, pp. E137-E142.

Chu, B., et al., "Organic-Film Photovoltaic Cell with Electroluminescence," Applied Physics Letters, vol. 81, No. 1, 2002, pp. 10-12.

Kolosov, D., et al., "1,8-Naphthalimides in Phosphorescent Organic LEDs: The Interplay Between Dopant, Exciplex, and Host Emission," JACS, vol. 124, No. 33, 2002, pp. 9945-9954.

Makinen, A.J., et al., "Vacuum Level Alignment in Organic Guest-Host Systems," Journal of Applied Physics, vol. 92, No. 3, 2002, pp. 1598-1603.

Losio, P.A., et al., "Singlet Excimer Electroluminescence Within N, N+-di-1-naphthalenyl-N,N'-diphenyl-[1,1'-biphenyl]-4,4'-diamine Based Diodes," Applied Physics Letters, vol. 89, No. 4, 2006, pp. 041914-1-3.

Imahori, H., et al., "Substituent Effects of Porphyrin Monolayers on the Structure and Photoelectrochemical Properties of Self-Assembled Monolayers of Porphyrin on Indium-Tin Oxide Electrode," J. Phys. Chem. B, vol. 108, No. 16, 2004, pp. 5018-5025.

Lee, J.K., et al., "Thin Film Light Emitting Devices From an Electroluminescent Ruthenium Complex," Applied Physics Letters, vol. 69, No. 12, 1996, pp. 1686-1688.

* cited by examiner

VACUUM LEVEL _____
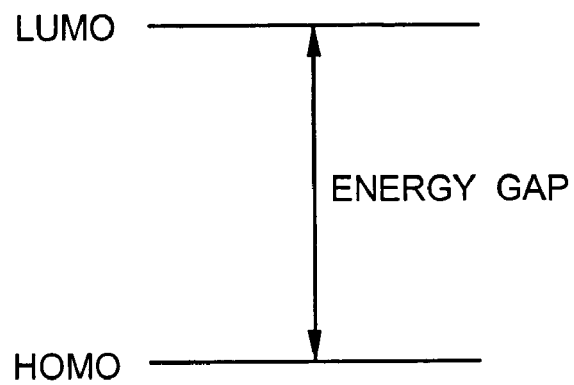
FIG. 2
FIG. 3
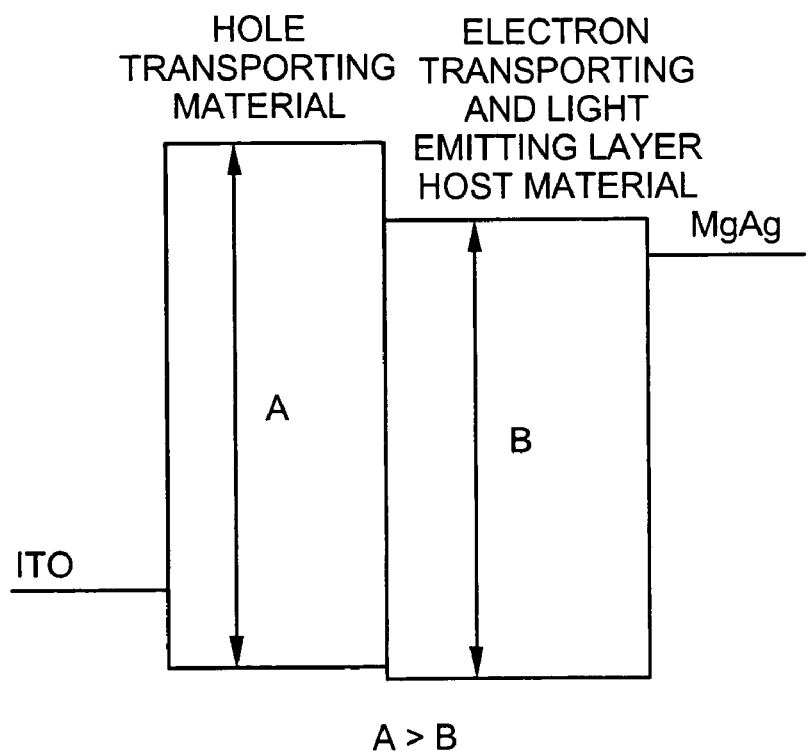
A > B

– – – – – – – ABSORPTION SPECTRUM OF HOLE TRANSPORTING MATERIAL

· · · · · · · · · · · · · · · LIGHT EMISSION SPECTRUM OF HOST MATERIAL

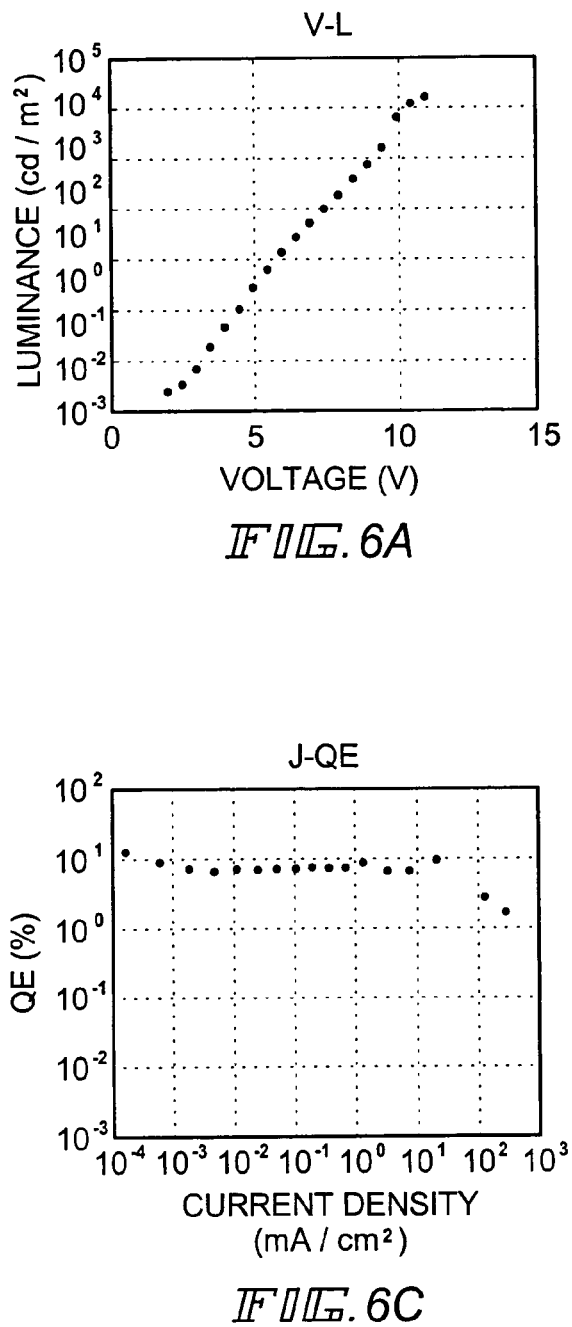
FIG. 6A
FIG. 6C
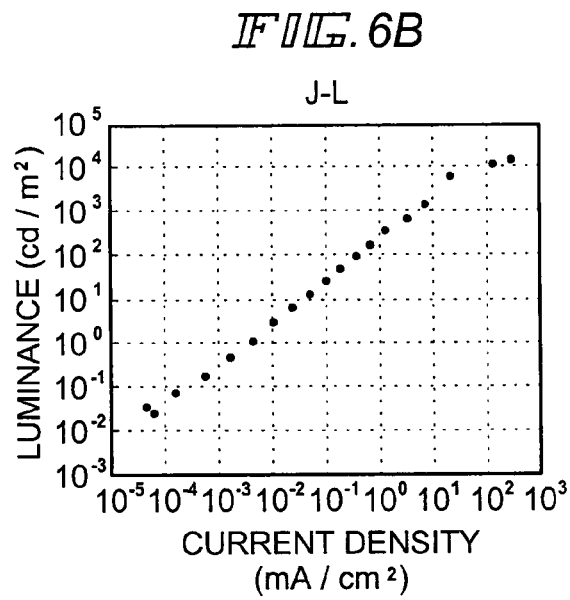
FIG. 6B
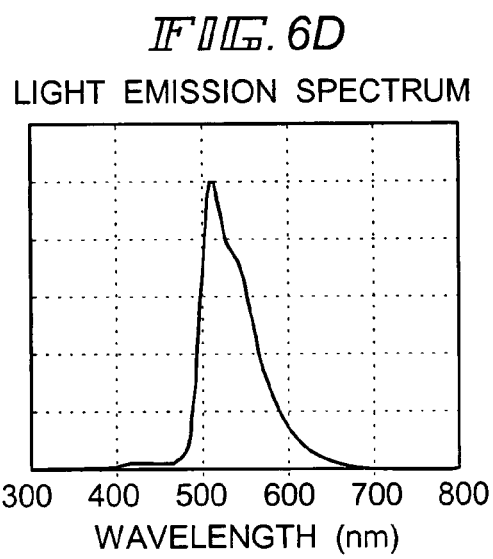
FIG. 6D

LIGHT EMITTING DEVICE

This application is a continuation of U.S. application Ser. No. 10/304,410, filed on Nov. 26, 2002 now U.S. Pat. No. 6,734,457.

BACKGROUND OF THE INVENTION

1. Field of the Invention

The present invention relates to an organic light emitting device constituted by an anode, an organic compound film capable of emitting light under the action of an electric field, and a cathode. In particular, the present invention relates to an organic light emitting device using a light emitting material which emits light in a triplet exited state.

2. Description of the Related Art

An organic light emitting device is a device designed by utilizing a phenomenon in which electrons and holes are caused to flow into an organic compound film through two electrodes by application of a voltage to cause emission of light from molecules in an excited state (excited molecules) formed by recombination of the electrons and holes.

Emission of light from an organic compound is a conversion into light of energy released when excited molecules are formed and then deactivated into the ground state. Deactivation processes causing such emission of light are broadly divided into two kinds: a process in which deactivation proceeds via a state in which excited molecules are singlet excited molecules (in which fluorescence is caused), and a process in which excited molecules are triplet excited molecules. Deactivation processes via the triplet excited molecule state include an emission process in which phosphorescence is caused and a triplet-triplet extinction process. However, there are basically only a small number of organic materials capable of changing in accordance with the phosphorescent deactivation process at room temperature. (In ordinary cases, thermal deactivation different from deactivation with emission of light occurs.) The majority of organic compounds used in organic light emitting devices are materials which emit light by fluorescence via the singlet excited molecule state, and many organic light emitting devices use fluorescence.

Organic light emitting devices using such organic compounds capable of emitting light by fluorescence are based on the two-layer structure which was reported by C. W. Tang et al. in 1987 (Reference 1: C. W. Tang and S. A. Vanslyke, "Organic electroluminescent diodes", Applied Physics Letters, Vol. 51, No.12, 913-915 (1987)), and in which an organic compound film formed of layers of two or more organic compounds and having a total thickness of about 100 nm is interposed between electrodes. Adachi et al. thereafter proposed a three-layer structure in 1988 (Reference 2: Chihaya ADACHI, Shozuo TOKITO, Tetsuo TSUTSUI and Shogo SAITO, "Electroluminescence in Organic Films with Three-Layered Structure", Japanese Journal of Applied Physics, Vol. 27, No.2, L269-L271 (1988)). Multilayer device structures based on applications of these layered structures are being presently used.

Devices in such multilayer structures are characterized by "layer function separation", which refers to the method of separately assigning functions to layers, instead of making one organic compound have various functions. For example, a device of two-layer structure uses a hole transporting layer having the function of transporting positive holes, and a light emitting and electron transporting layer having the function of transporting electrons and the function of emitting light. Also, a device of three-layer structure uses a hole transporting layer having only the function of transporting positive holes, an electron transporting layer having only the function of transporting electrons, and a light-emitting layer which is capable of emitting light, and which is formed between the two transporting layers. Such a layer function separation method has the advantage of increasing the degree of molecular design freedom of organic compounds used in an organic light emitting device.

For example, a number of characteristics, such as improved facility with which either of electrons and holes are injected, the function of transporting both the carriers, and high fluorescent quantum yield, are required of a device of single-layer structure. In contrast, in the case of a device of two-layer structure or the like using an electron transporting and light emitting layer, an organic compound to which positive holes can be easily injected may be used as a material for a hole transporting layer, and an organic compound to which electrons can be easily injected and which have high fluorescent quantum yield may be used as a material for an electron transporting layer. Thus, requirements of one layer are reduced and the facility with which the material is selected is improved.

In the case of a device of three-layer structure, a "light emitting layer" is further provided to enable separation between the electron transporting function and the light emitting function. Moreover, a material in which a fluorescent pigment (guest) of high quantum yield such as a laser pigment is dispersed in a solid medium (host) material can be used for the light emitting layer to improve the fluorescent quantum yield of the light emitting layer. Thus, not only the effect of largely improving the quantum yield of the organic light emitting device but also the effect of freely controlling the emission wavelength through the selection of fluorescent pigments to be used can be obtained (Reference 3: C. W. Tang, S. A. Vanslyke and C. H. Chen, "Electroluminescence of doped organic thin films", Journal of Applied Physics, Vol. 65, 3610-3616 (1989)). A device in which such a pigment (guest) is dispersed in a host material is called a doped device.

Another advantage of the multilayer structure is a "carrier confinement effect". For example, in the case of the two-layer structure described in Reference 1, positive holes are injected from the anode into the hole transporting layer, electrons are injected from the cathode into the electron transporting layer, and the holes and electrons move toward the interface between the hole transporting layer and the electron transporting layer. Thereafter, while holes are injected into the electron transporting layer because of a small ionization potential difference between the hole transporting layer and the electron transporting layer, electrons are blocked by the hole transporting layer to be confined in the electron transporting layer without being injected into the hole transporting layer because the electrical affinity of the hole transporting layer is low and because the difference between the electrical affinities of the hole transporting layer and the electron transporting layer is excessively large. Consequently, both the density of holes and the density of electrons in the electron transporting layer are increased to achieve efficient carrier recombination.

As an example of a material that is effective in exhibiting the carrier confinement effect, there is a material having an extremely large ionization potential. It is difficult to inject holes into the material having a large ionization potential, so that such a material is widely used as a material capable of blocking holes (hole blocking material). For example, in the case where the hole transporting layer composed of an aromatic diamine compound and the electron transporting layer composed of tris(8-quinolinolato)-aluminum (hereinafter referred to as "Alq") are laminated as reported in Reference 1, if a voltage is applied to the device, Alq in the electron transporting layer emits light. However, by inserting the hole blocking material between the two layers of the device, holes are confined in the hole transporting layer, so that light can be emitted from the hole transporting layer side as well.

As described above, layers having various functions (hole transporting layer, hole blocking layer, electron transporting layer, electron injection layer, etc.) are provided to improve the efficiency and to enable control of the color of emitted light, etc. Thus, multilayer structures have been established as the basic structure for current organic light emitting devices.

Under the above-described circumstances, in 1998, S. R. Forrest et al. made public a doped device in which a triplet light emitting material capable of emission of light (phosphorescence) from a triplet excited state at a room temperature (a metal complex having platinum as a central metal in the example described in the reference) is used as a guest (hereinafter referred to as "triplet light emitting device) (Reference 4: M. A. Baldo, D. F. O'Brien, Y You, A. Shoustilkov, S. Silbey, M. A. Thomoson and S. R. Forrest, "Highly efficient phosphorescent emission from organic electroluminescent devices", Nature, Vol. 395, 151-154 (1998)). For distinction between this triplet light emitting device and devices using emission of light from a singlet excited state, the latter device will be referred to as "singlet light emitting device".

As mentioned above, excited molecules produced by recombination of holes and electrons injected into an organic compound include singlet excited molecules and triplet excited molecules. In such a case, singlet excited molecules and triplet excited molecules are produced in proportions of 1:3 due to the difference between the multiplicities of spin. Basically, in the existing materials, triplet excited molecules are thermally deactivated at room temperature. Therefore only singlet excited molecules have been used for emission of light, only a quarter of produced excited molecules are used for emission of light. If triplet excited molecules can be used for emission of light, a light emission efficiency three to four times higher than that presently achieved can be obtained.

In Reference 4, the above-described multilayer structure is used. That is, the device is such structured that: 4,4'-bis[N-(1-naphthyl)-N-phenyl-amino]-biphenyl (hereinafter referred to as "α-NPD") that is an aromatic amine-based compound, is used as the hole transporting layer; Alq with 6% of 2,3,7,8,12,13,17,18-octaethyl-21H,23H-porphyrin-platinum (hereinafter referred to as "PtOEP") dispersed therein is used as the light emitting layer; and Alq is used as the electron transporting layer. As to the external quantum efficiency, the maximum value is 4% and a value of 1.3% is obtained at 100 cd/m$^2$.

Thereafter, the device structure utilizing the hole blocking layer is used. That is, the device is such structured that: α-NPD is used as the hole transporting layer; 4,4'-N,N'-dicarbazole-biphenyl (hereinafter referred to as "CBP") with 6% of PtOEP dispersed therein is used as the light emitting layer; 2,9-dimethyl-4,7-diphenyl-1,10-phenanthroline (hereinafter referred to as "BCP") is used as the hole blocking layer; and Alq is used as the electron transporting layer. As to the external quantum efficiency, a value of 2.2% is obtained at 100 cd/m$^2$ and the maximum value is 5.6%, so that the light emission efficiency of the device is improved (Reference 5: D. F. O'Brien, M. A. Baldo, M. E. Thompson and S. R. Forrest, "Improved energy transfer in electrophosphorescent devices", Applied Physics Letters, Vol. 74, No. 3, 442-444 (1999)).

Further, a triplet light emitting device is reported which uses tris(2-phenylpyridine)iridium (hereinafter referred to as "Ir(ppy)$_3$") as the triplet light emitting material (Reference 6: M. A. Baldo, S. Lamansky, P. E. Burrows, M. E. Thompson and S. R. Forrest, "Very high-efficiency green organic light-emitting devices based on electrophosphorescence", Applied Physics Letters, Vol. 75, No. 1, 4-6 (1999)). Thereafter, it is reported that with the same device structure as in Reference 6, the film thicknesses of the organic compound films are optimized, whereby a highly efficient organic light emitting device is obtained whose external quantum efficiency is 14.9% at 100 cd/m$^2$ (Reference 7: Teruichi Watanabe, Kenji Nakamura, Shin Kawami, Yoshinori Fukuda, Taishi Tsuji, Takeo Wakimoto, Satoshi Miyaguchi, Masayuki Yahiro, Moon-Jae Yang, Tetsuo Tsutsui, "Optimization of emitting efficiency in organic LED cells using Ir complex", Synthetic Metals, Vol. 122, 203-207 (2001)). Thus, in actuality, it becomes possible to produce the devices with the light emission efficiency almost three times that in the conventional singlet light emitting device.

Searches are presently being made for triplet light emitting materials using iridium or platinum as a central metal, triplet light emitting devices having markedly high efficiency in comparison with singlet light emitting devices are now attracting attention, and studies about such devices are being energetically made.

Although triplet light emitting devices have light emission efficiency much higher than that of singlet light emitting devices, they are incomparably shorter in life than singlet light emitting materials and lack stability. Also, a multilayer structure adopted to increase the efficiency of a triplet light emitting device must be formed so as to have at least four layers. Therefore triplet light emitting devices simply have the drawback of requiring much time and labor for fabrication.

With respect to the life of devices, a report has been made which says that the half-life of a device having a multilayer structure formed of a hole transporting layer using α-NPD, a light emitting layer using CBP as a host material and Ir(ppy)$_3$ as a guest (dopant) material, a hole blocking layer using BCP, and an electron transporting layer using Alq is only 170 hours under a condition of an initial luminance of 500 cd/M$^2$ (Reference 8: Tetsuo TSUTSUI, Moon-Jae YANG, Masayuki YAHIRO, Kenji NAKAMURA, Teruichi WATANABE, Taishi TSUJI, Yoshinori FUKUDA, Takeo WAKIMOTO and Satoshi MIYAGUCHI, "High Quantum Efficiency Inorganic Light-Emitting Devices with Iridium-Complex as a Triplet Emissive Center", Japanese Journal of Applied Physics, Vol. 38, No.12B, L1502-L1504 (1999)). By considering this life, it must be said that no solution of the life problem is close at hand.

In Reference 8, low stability of BCP used as a hole blocking material is mentioned as a cause of the limitation of life. Triplet light emitting devices use as a basic structure the device structure described in Reference 5, and use the hole blocking layer as an indispensable element. FIG. 12 show the structure of a conventional triplet light emitting device. In the device structure shown in FIG. 12, an anode 1102 is formed on a substrate 1101, a multilayer organic compound film formed of a hole transporting layer 1103, a light emitting layer 1104, a hole blocking layer 1105, and an electron transporting layer 1106 is formed on the anode 1102, and a cathode 1107 is formed on the multilayer film. While efficient carrier recombination can be achieved by the carrier confinement effect of the hole blocking layer, the life of the device is limited because the hole blocking material ordinarily used is considerably low in stability. Also, CBP used as a host material is also low in stability and is also considered to be a cause of the limitation of the life.

A device of three-layer structure using no hole blocking layer has been fabricated (Reference 9: Chihaya ADACHI, Marc A. Baldo, Stephen R. Forrest and Mark E. Thompson, "High-efficiency organic electrophosphorescent devices with tris(2-phinylpyridine)iridium doped into electron-transporting materials", Applied Physics Letters, Vol. 77, No.6, 904-906 (2000)). This device is characterized by using electron transporting materials as a host material instead of CBP which is the to have such characteristics as to transport both the carriers. However, the electron transporting materials used as a host material are BCP which is used as a hole blocking material, 1,3-bis(N,N-t-butyl-phenyl)-1,3,4-oxazole (hereinafter referred to as "OXD7"), and 3-phenyl-4-(1'-naphthyl)-5-phenyl-1,2,4-triazole (hereinafter referred to as "TAZ"). Although no hole blocking layer is used, the materials ordinarily used as a hole blocking material are used in the device. BCP is, of course, lower in stability than any other material, so that the stability of the device is low, while the efficiency is high.

A simple two-layer device structure using no hole blocking material has also been reported (Reference 10: Chihaya ADACHI, Raymond KWONG, Stephen R. Forrest, "Efficient electrophosphorescence using a doped ambipolar conductive molecular organic thin film", Organic Electronics, Vol. 2, 37-43 (2001)). In this device, however, CBP is used as a host material, so that the stability is low, while the light emission efficiency is high.

As described above, while triplet light emitting devices having high light emission efficiency have been reported, no triplet light emitting device improved both in efficiency and in stability has been reported. Difficulty in obtaining such an improved device is due to the instability of host materials and hole blocking materials used.

SUMMARY OF THE INVENTION

An object of the present invention is to provide a triplet light emitting device in which unstable materials such as those described above are not used while the device structure is simplified to obtain high efficiency and improved stability, and which can be fabricated easily and efficiently in comparison with the conventional devices.

According to the present invention, a triplet light emitting device designed to achieve the above-described object has a simple device structure (FIG. 1) in which no hole blocking layer such as that provided in the conventional triplet light emitting devices is used, and in which an organic compound film is formed as a multilayer film constituted by a hole transporting layer and a layer in which dopant material capable of triplet light emission is dispersed in a stable electron transporting material. That is, a device structure is provided in which an anode 102 is formed on a substrate 101, a hole transporting layer 103 constituted by a hole transporting material, an electron transporting and light emitting layer 104 constituted by an electron transporting material and a dopant material capable of triplet light emission are successively formed on the anode 102, and a cathode 105 is formed on the layer 104. The region interposed between the anode 102 and the cathode 105 (i.e., the hole transporting layer 103 and the electron transporting and light emitting layer 104) corresponds to the organic compound film.

The present invention is characterized in that, in an organic light emitting device constituted by an anode, an organic compound film, and a cathode, the organic compound film includes a hole transporting layer constituted by a hole transporting material, and an electron transporting layer formed adjacent to the hole transporting layer and constituted by an electron transporting material, and a light emitting material capable of emitting light from a triplet excited state is added in the electron transporting layer.

A hole injection layer may be inserted between the anode 102 and the hole transporting layer 103. Also, an electron injection layer may be inserted between the cathode 105 and the electron transporting and light emitting layer 104. Further, both the hole injection layer and the electron injection layer may be inserted.

As a means for achieving the object of the present invention, it is important to consider the combination of a hole transporting material and an electron transporting material in the above-described device for preventing emission of light from the hole transporting layer 103.

Accordingly, the present invention is characterized in that the energy difference between the highest occupied molecular orbit level and the lowest unoccupied molecular orbit level in the hole transporting material is larger than the energy difference between the highest occupied molecular orbit level and the lowest unoccupied molecular orbit level in the electron transporting material.

Another means for achieving the object resides in avoiding overlap between an absorption spectrum of the hole transporting material and a light emission spectrum of the electron transporting material. In this case, it is preferred not only that the spectrums do not overlap each other, but also that the positional relationship between the spectrums be such that the absorption spectrum of the hole transporting material is on the shorter-wavelength side of the light emission spectrum of the electron transporting material.

As a means for achieving the object of the present invention, it is important to adopt a device arrangement enabling the dopant capable of triplet light emission to easily trap the carriers in improving the light emission efficiency of the above-described triplet light emitting device of the present invention.

Accordingly, the present invention is characterized in that both the highest occupied molecular orbit level and the lowest unoccupied molecular orbit level of the light emitting material capable of emitting light from a triplet excited state are in the energy gap between the highest occupied molecular orbit level and the lowest unoccupied molecular orbit level of the electron transporting material.

As still another means for achieving the object of the present invention, the light emitting device is characterized in that the value of ionization potential of the hole transporting material is equal to or larger than the value of ionization potential of the light emitting material capable of emitting light from a triplet excited state.

Further, as another means for achieving the object of the present invention, the light emitting device is characterized in that the absolute value of a value indicating the lowest unoccupied molecular orbit level of the hole transporting material is smaller by 0.2 eV or more than the absolute value of a value indicating the lowest unoccupied molecular orbit level of the electron transporting material.

It is more preferable to use a device arrangement corresponding to a combination of these means, i.e., an arrangement in which the value of ionization potential of the hole transporting material is equal to or larger than the value of ionization potential of the light emitting material capable of emitting light from a triplet excited state, and the absolute value of a value indicating the lowest unoccupied molecular orbit level of the hole transporting material is smaller by 0.2 eV or more than the absolute value of a value indicating the lowest unoccupied molecular orbit level of the electron transporting material.

In view of the above description, the present invention is characterized in that used as the preferred hole transporting material is one selected from the group consisting of 4,4',4"-tris(N-carbazole)triphenylamine, 4,4'-bis[N,N-bis(3-methylphenyl)-amino]-diphenylmethane, 1,3,5-tris[N,N-bis(2-methylphenyl)-amino]-benzene, 1,3,5-tris[N,N-bis(3-methylphenyl)-amino]-benzene, and 1,3,5-tris[N,N-bis(4-methylphenyl)-amino]-benzene.

Further, the present invention is characterized in that used as the electron transporting material is one selected from the group consisting of 2,2',2"-(1,3,5-benzenetriyl)tris-[1-phenyl-1H-benzoimidazole], lithiumtetra(2-(2-hydroxyphenyl)benzooxazolatoboron, bis(2-(2-hydroxyphenyl)benzooxazolato)(triphenylsilanolato)aluminum, bis(2-(2-hydroxyphenyl)benzothiazolato)(triphenylsilanolato) aluminum, 2-(2-hydroxyphenyl)benzooxazolatolithium, (2-(2hydroxyphenyl)benzooxazolato)-diphenylboron, tris(8-quinolinolato)-aluminum, bis(2-methyl-8-quinolinolato) (triphenylsilanolato)aluminum, bis(2-methyl-8-quinolinolato)(4-phenylphenolato)aluminum, lithiumtetra (2-methyl-8-hydroxy-quinolinato)boron, (2-methyl-8-quinolinolato)-diphenylboron, and bis(2-methyl-8-quinolinolato)aluminiumhydroxide.

Further, in the device of the present invention, it is effective to use the hole transporting material and the electron transporting material in combination.

BRIEF DESCRIPTION OF THE DRAWINGS

In the accompanying drawings:

FIG. 2 is a diagram showing HOMO and LUMO energy levels;

FIG. 3 is an energy gap diagram of the device;

FIGS. 6A to 6D are graphs showing an initial characteristic and a light emission spectrum in Embodiment 2;

DESCRIPTION OF THE PREFERRED EMBODIMENT

An embodiment mode of the present invention will be described in detail. An organic light emitting device may have at least one of an anode and a cathode made transparent to enable emitted light to be output. However, the embodiment mode of the present invention will be described with respect to a device structure in which a transparent anode is formed on a substrate and light is output through the anode. In actuality, the present invention can also be applied to a structure in which a cathode is formed on a substrate and light is output through the cathode, a structure in which light is output from the side opposite from a substrate, and a structure in which light is output through opposed electrodes.

Figure 1:
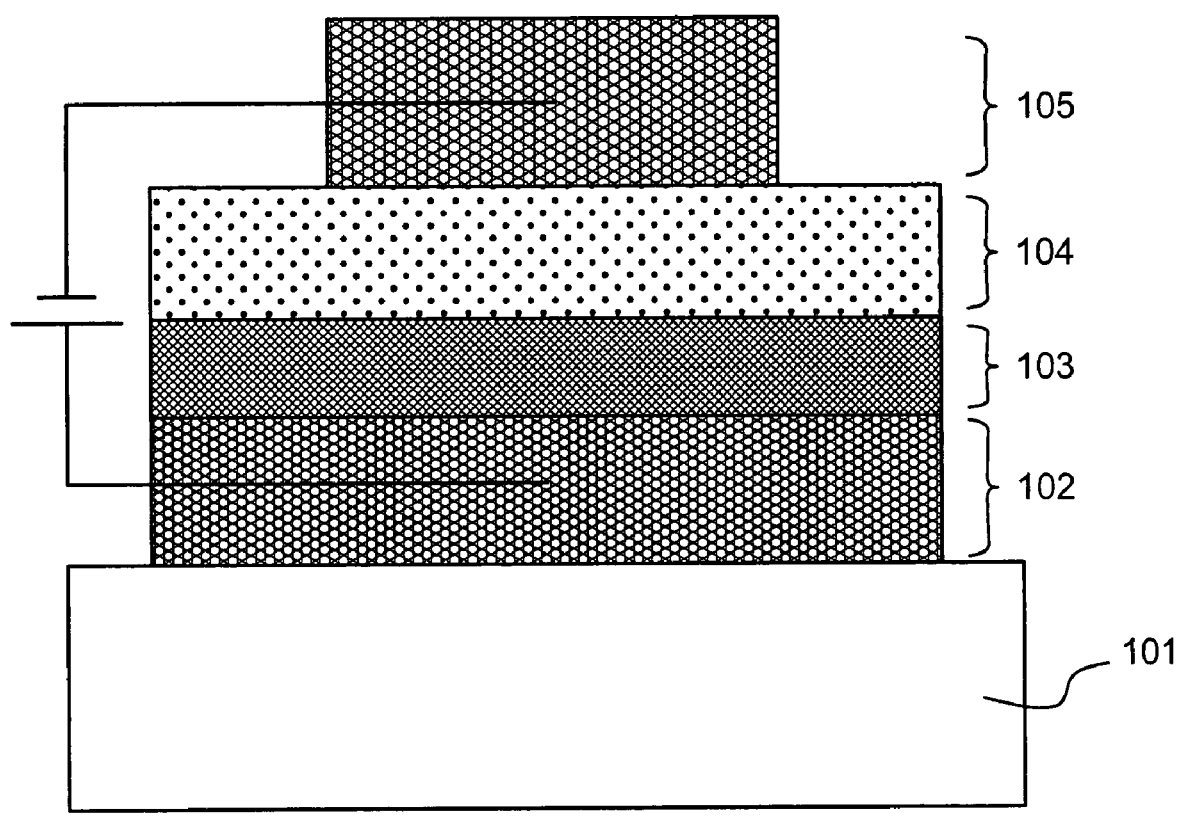
FIG. 1 is a diagram showing the device structure of a two-layer triplet light emitting device in accordance with the present invention.
Figure 12:
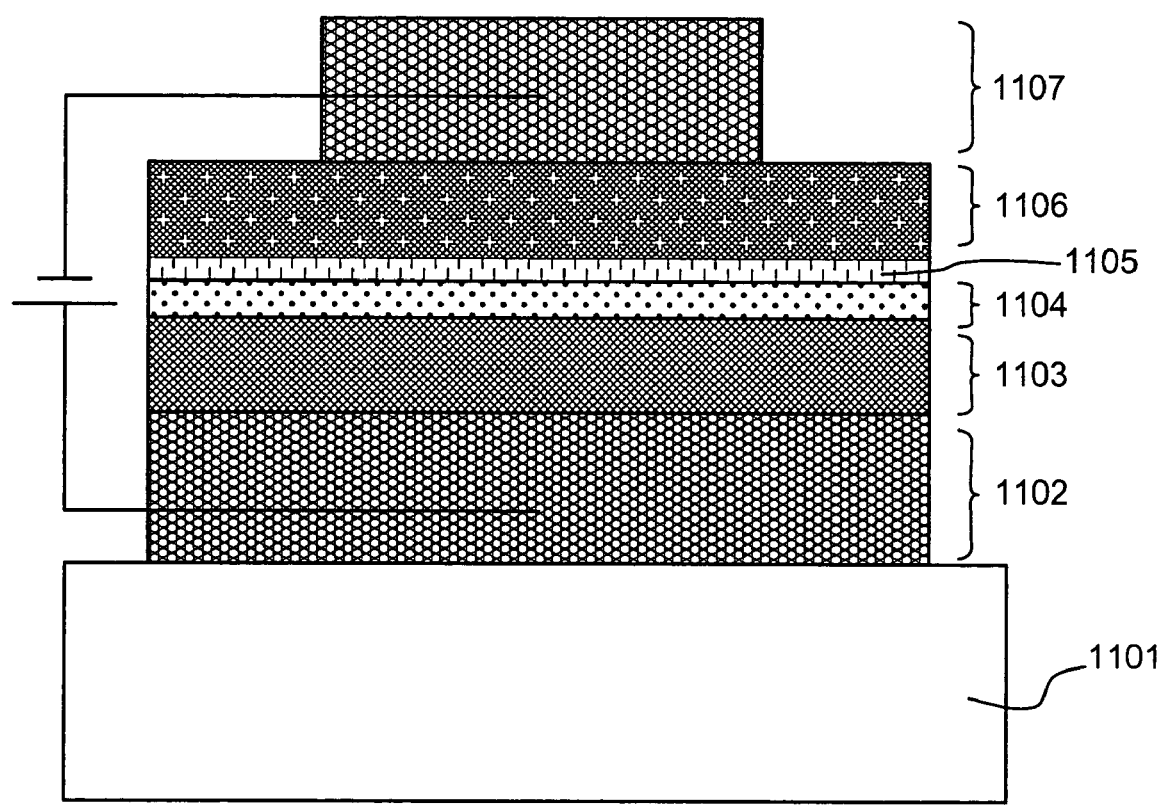
FIG. 12 is a diagram showing the device structure of a conventional triplet light emitting device.

As described above, the present invention is characterized in that use of a hole blocking layer in a triplet light emitting device is avoided (FIG. 1). However, the present invention is different from a method of fabricating a device designed only by removing the hole blocking layer from the conventional device structure (FIG. 12).

The conventional triplet light emitting device and the two-layer device of the present invention have different recombination regions. In the conventional triplet light emitting device, a hole blocking layer is used and the carrier recombination region corresponds to the interface between the light emitting layer and the hole blocking layer. In contrast, in the device structure proposed in the present invention, the carrier recombination region corresponds to the interface between the hole transporting layer and the electron transporting material provided as a host material.

Therefore it is important to consider a light emission mechanism in triplet light emitting devices. In general, two kinds of light emission mechanisms are conceivable as light emission mechanisms in devices using a guest-host light emitting layer using a dopant (guest).

The first light emission mechanism is emission from the dopant caused by transfer of energy from the host. In this case, both the carriers are injected into the host to form excited molecules of the host. The energy of the excited molecules is transferred to the dopant. The dopant is excited by the energy and emits light when deactivated. In triplet light emitting devices, the dopant is a material for emitting phosphorescence via a triplet excited molecule state, and light is therefore emitted by phosphorescence.

In the light emission mechanism based on transfer of energy, the magnitude of overlap of the light emission spectrum of the host material and the absorption spectrum of the dopant material is important. The positional relationship between the highest occupied molecular orbit (HOMO) and the lowest unoccupied molecular orbit (LUMO) in the host material and the dopant material is not important.

In this specification, the value of ionization potential measured by photoelectron spectrometry in atmospheric air is used as the value of the HOMO. The absorption ends of the absorption spectrum define the energy difference between the HOMO and the LUMO (hereinafter referred to as "energy gap value"). Therefore the value obtained by subtracting the energy gap value estimated from the absorption ends of the absorption spectrum from the value of ionization potential measured by photoelectron spectrometry is used as the value of the LUMO. In actuality, these values (HOMO (ionization potential), LUMO (energy gap value)) are negative since they are measured with reference to the vacuum level. However, they are shown as absolute values throughout the specification. Conceptual views of the HOMO, the LUMO, and the energy gap values are as shown in FIG. 2.

If both the energy levels of the HOMO and LUMO of the dopant material are placed in the energy gap between the HOMO and LUMO in the host material, a direct-recombination light emission mechanism, i.e., direction recombination of the carriers on the dopant when the carriers are trapped on the dopant, occurs as well as the above-described light emission mechanism based on transfer of energy from the host to the dopant. This is the second light emission mechanism.

However, in a case where the dopant material and the host material are in such an energy level relationship, it is ordinarily difficult to separately determine the contribution of each light emission mechanism to emission of light since transfer of energy is allowed according to the conditions, and there is a possibility of both the light emission mechanisms contributing to light emission.

A case where a triplet light emitting device is emitting light by the energy transfer mechanism (first light emission mechanism) will be discussed. In the conventional device structure, since the carrier recombination region is the interface between the light emitting layer and the hole blocking layer, there is a possibility of transfer of energy to the hole blocking material as well as transfer of energy from the host material to the dopant material. However, since the absorption spectrum of the hole blocking material is on an extremely short wavelength side, there is, therefore, no overlap between the absorption spectrum of the hole blocking layer and the light emission spectrum of the host material reported with respect to the conventional triplet light emitting devices, and there is no possibility of transfer of energy between the host material and the hole blocking material. That is, the conventional triplet light emitting devices have such device structure that transfer of energy from the host material to the hole blocking material does not occur.

In contrast, in the device structure in accordance with the present invention, the carrier recombination region is the interface between the hole transporting layer containing a hole transporting material and the electron transporting and light emitting layer containing a host material. In the device of the present invention, therefore, there is a possibility of transfer of energy from the host material to the hole transporting material. If energy transfer from the host material to the hole transfer material occurs, efficient emission of light cannot be achieved.

The relationship between the magnitudes of the energy gap value of the host material and the energy gap value of the hole transporting material can be referred to as a rough guide with respect to energy transfer. If the energy gap value of the host material is smaller than the energy gap value of the hole transporting material, it is difficult to excite the hole transporting material by transfer of energy from the host material. For this reason, it is preferred that the hole transporting material have an energy gap value larger than that of the host material in order to avoid transfer of energy from the host material to the hole transporting material.

FIG. 3 is a relating energy diagram. The materials may be selected so that the energy gap value A of the hole transporting material is larger than the energy gap value B of the host material, as shown in FIG. 3.

A method of selecting, as a condition for prevention of energy transfer between the host and hole transporting materials, a combination of materials such that there is no overlap between the light emission spectrum of the host material and the absorption spectrum of the hole transporting material may be used. When this method is used, it is preferred that the absorption spectrum of the hole transporting material is placed on the shorter-wavelength side of the light emission spectrum of the electron transporting material.

Figure 4A:
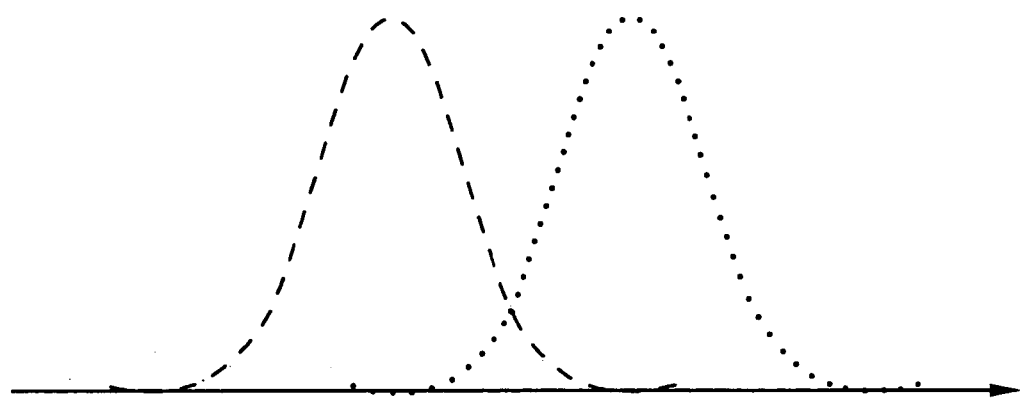
FIGS. 4A and 4B are diagrams showing the positional relationship between the light emission spectrum of a host material and the absorption spectrum of a hole transporting material.
Figure 4B:
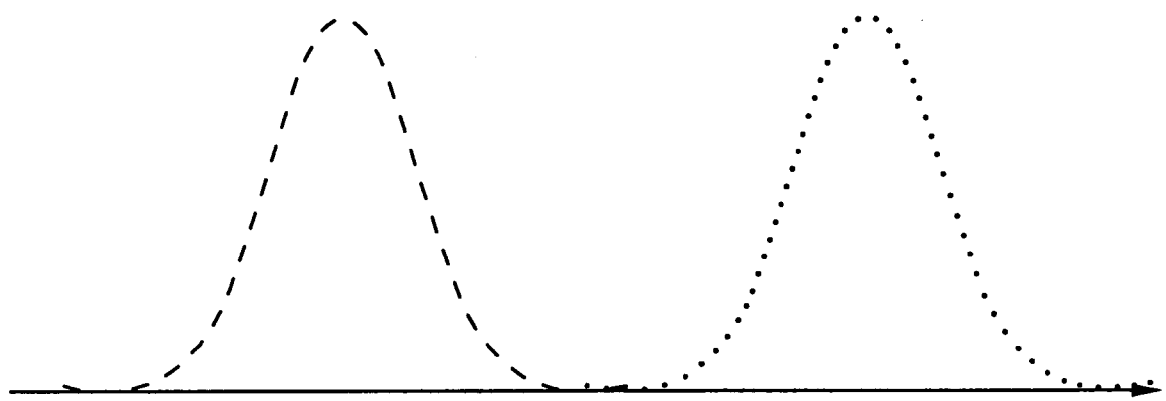
Figure 5A:
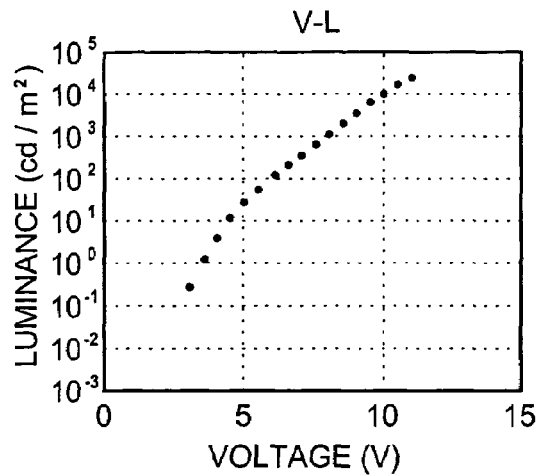
FIGS. 5A to 5D are graphs showing an initial characteristic and a light emission spectrum in Embodiment 1.
Figure 5B:
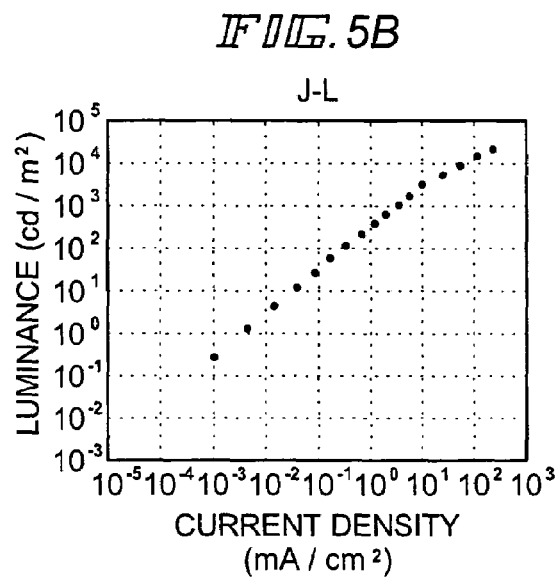
Figure 5C:
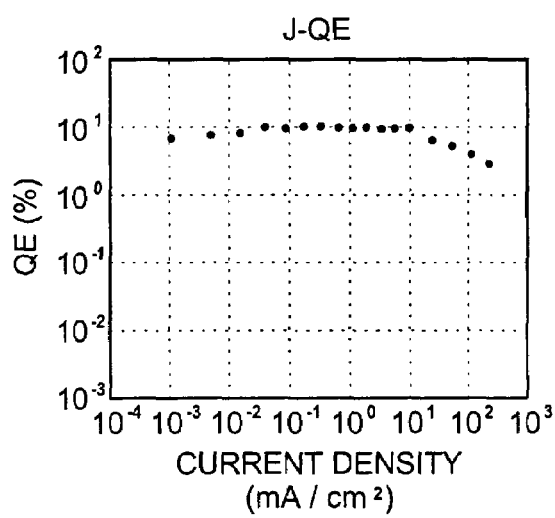
Figure 5D:
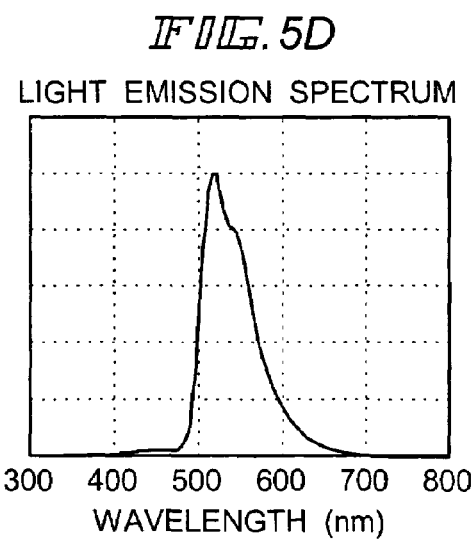
Figure 7A:
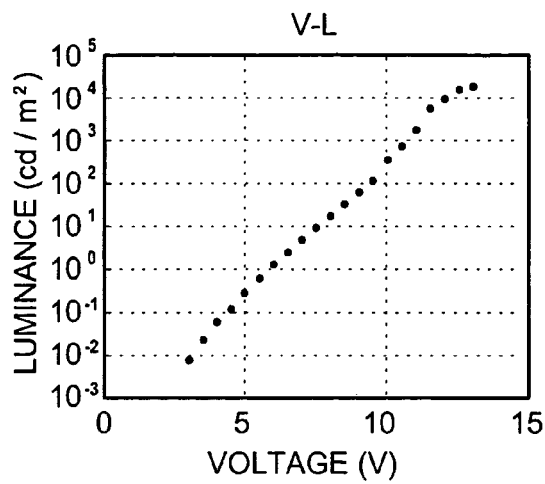
FIGS. 7A to 7D are graphs showing an initial characteristic and a light emission spectrum in Embodiment 3.
Figure 7B:
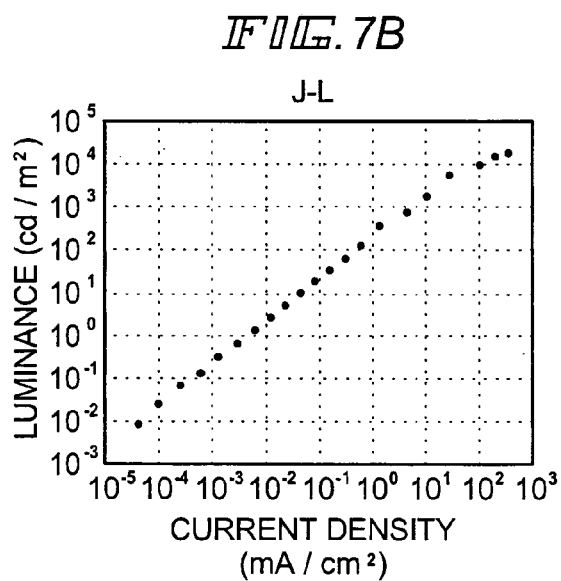
Figure 7C:
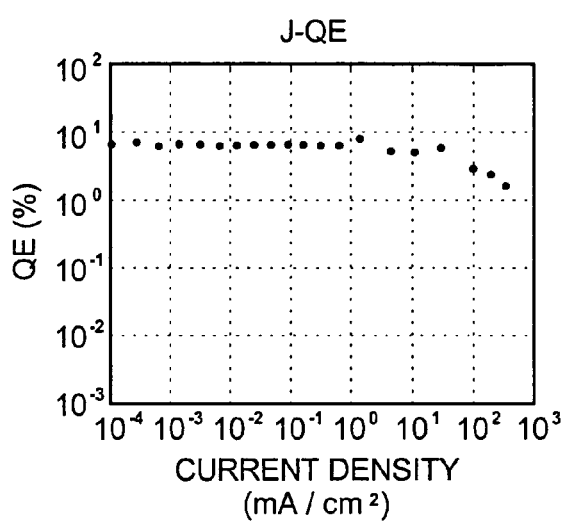
Figure 7D:
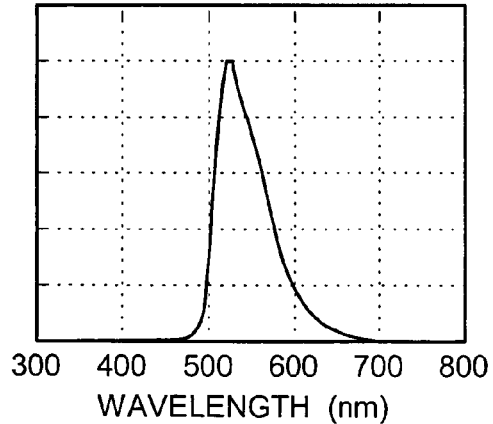
Figure 8A:
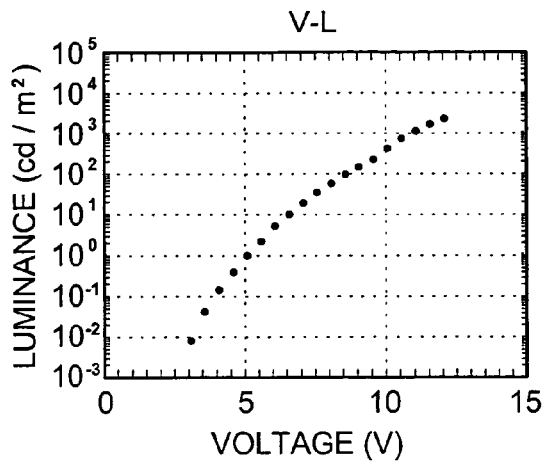
FIGS. 8A to 8D are graphs showing an initial characteristic and a light emission spectrum in Embodiment 4.
Figure 8B:
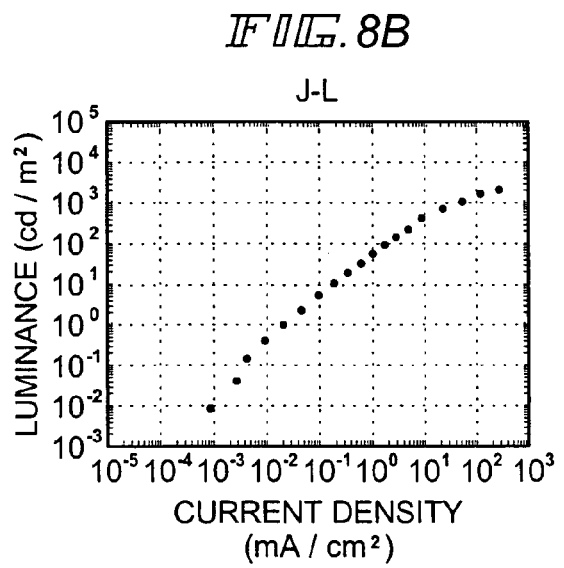
Figure 8C:
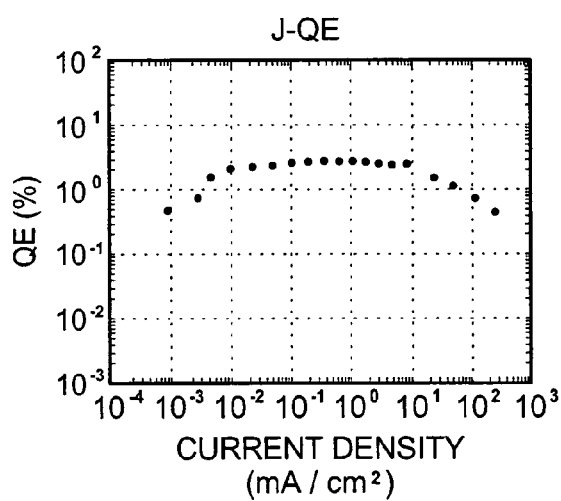
Figure 8D:
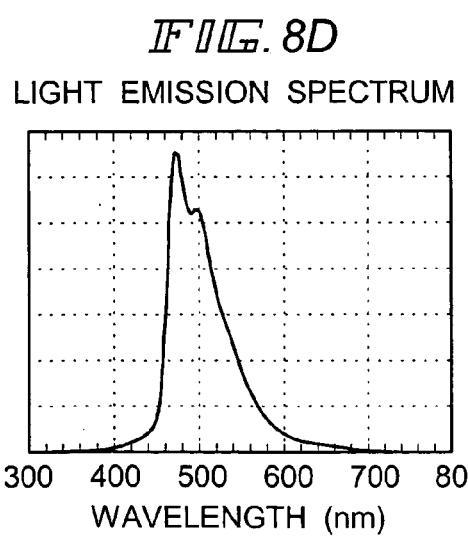
Figure 9A:
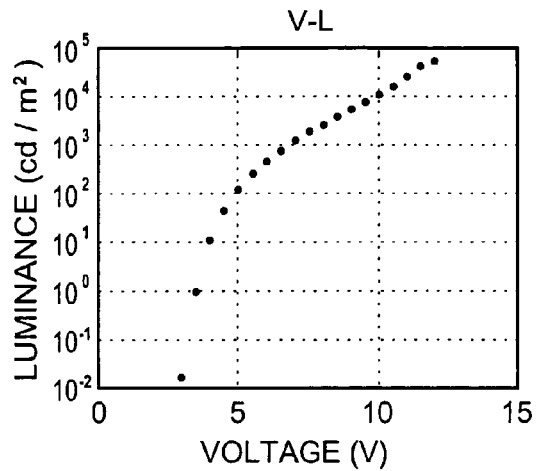
FIGS. 9A to 9D are graphs showing an initial characteristic and a light emission spectrum in Comparative Example 1.
Figure 9B:
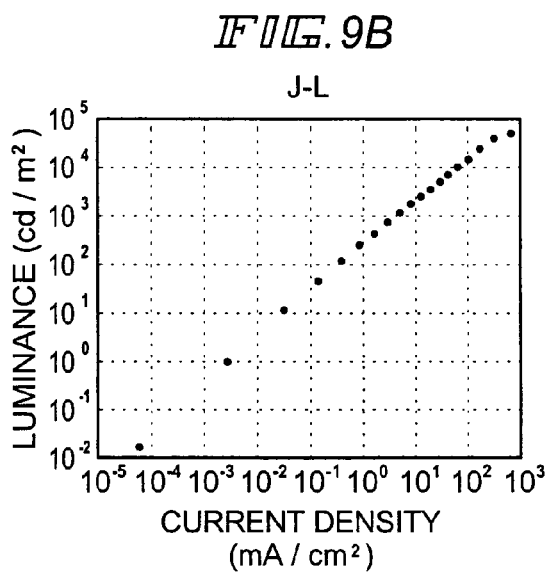
Figure 9C:
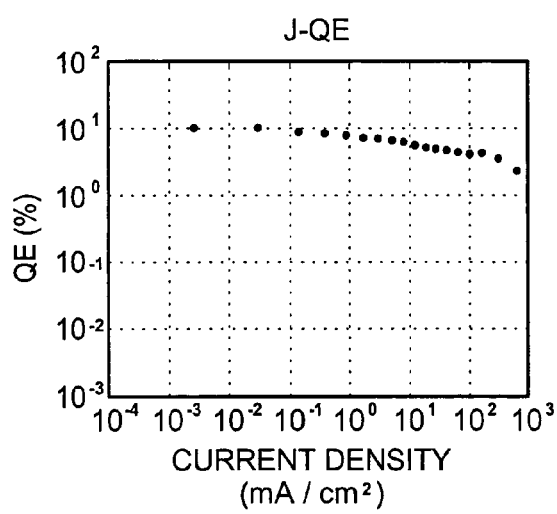
Figure 9D:
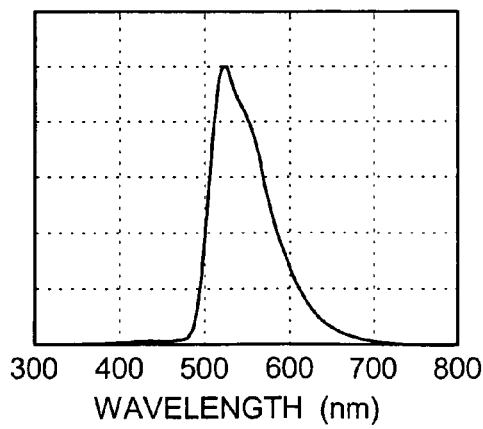
Figure 10A:
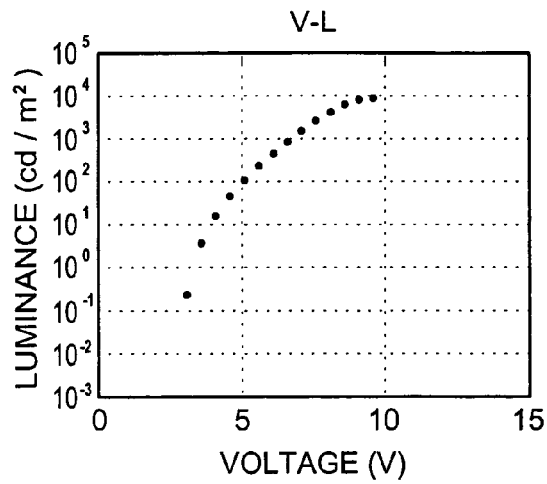
FIGS. 10A to 10D are graphs showing an initial characteristic and a light emission spectrum in Comparative Example 2.
Figure 10B:
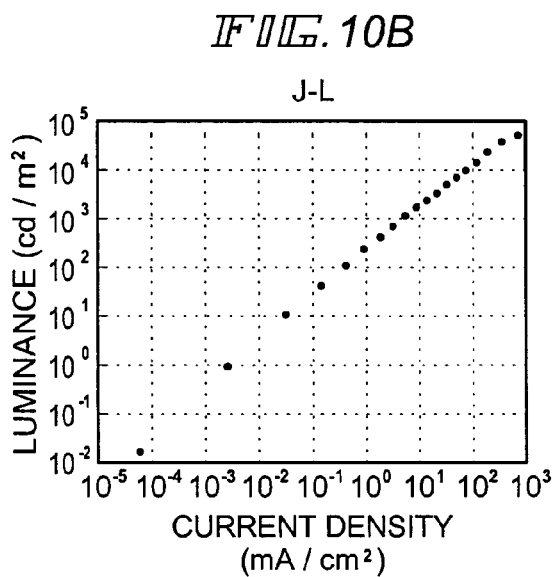
Figure 10C:
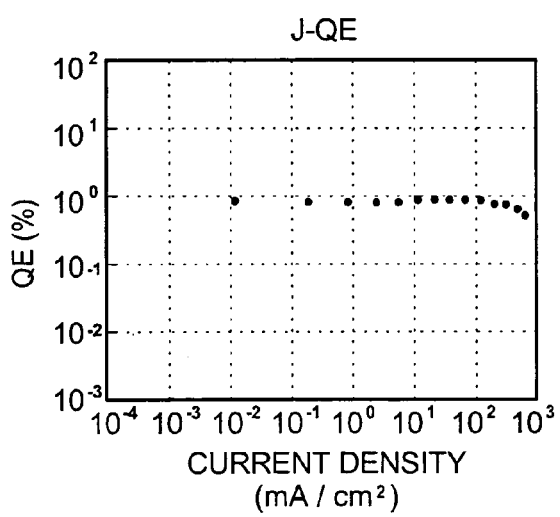
Figure 10D:
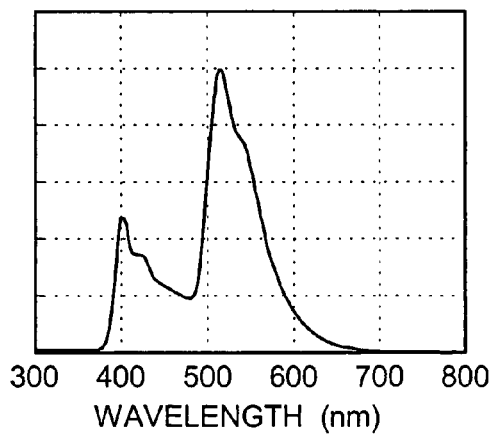
Figure 11A:
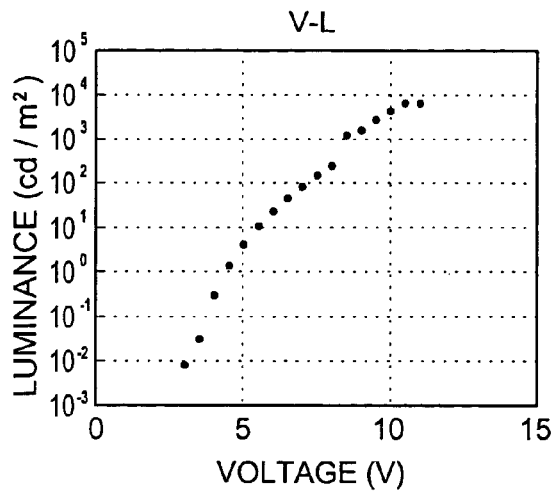
FIGS. 11A to 11D are graphs showing an initial characteristic and a light emission spectrum in Comparative Example 3.
Figure 11B:
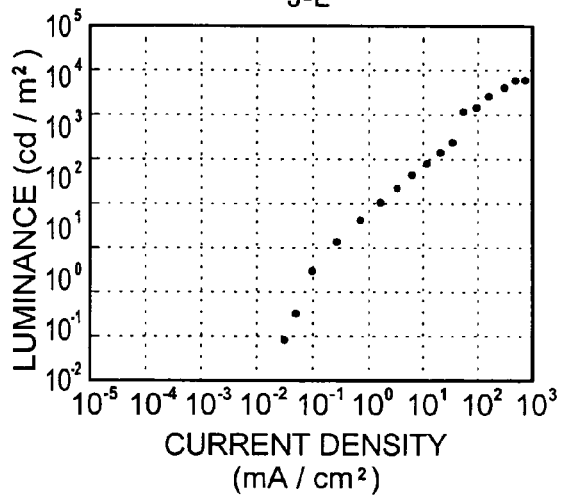
Figure 11C:
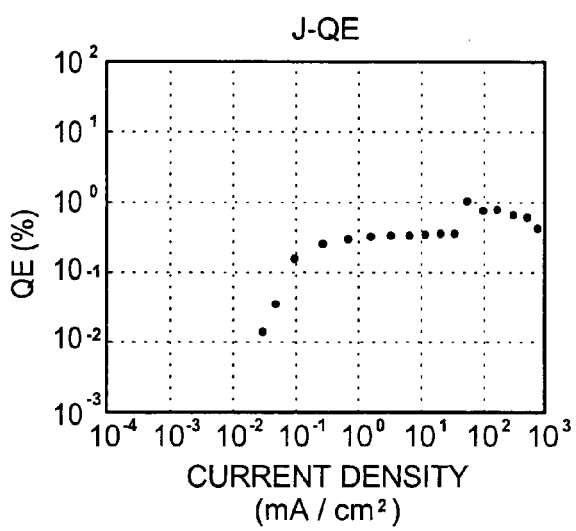
Figure 11D:
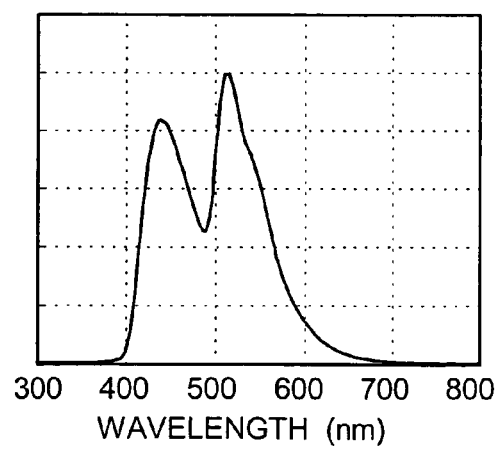

FIGS. 4A and 4B illustrate this condition. The positional relationship between the spectrums in a case where transfer of energy occurs between the host material and the hole transporting material is indicated in FIG. 4A, and the positional relationship between the spectrums in a case where transfer of energy does not occur between the host material and the hole transporting material is indicated in FIG. 4B. According to the present invention, the positional relationship of FIG. 4B is preferred.

It is important to consider a condition other than those described above if a host material is selected such that both the energy levels of the HOMO and LUMO of the dopant material are placed in the energy gap between the HOMO and LUMO of the host material, because in such a case the direct-recombination light emission mechanism (second light emission condition) is taken into consideration.

In such a case, it is suitable to set the value of the ionization potential indicating the HOMO of the hole transporting material to a larger value in order to facilitate injection of the hole carrier from the hole transporting material to the dopant material, That is, a combination of materials is selected such that the ionization potential of the hole transporting material is higher than that of the dopant material. If the ionization potential of the hole transporting material is excessively high, the facility with which holes are injected from the anode into the hole transporting material is reduced. In such a case, a hole injection layer may be provided between the anode and the hole transporting layer to facilitate injection.

It is thought that the dopant traps the electron carrier through the electron-transporting host. In a case where electrons not trapped by the dopant reach the interface on the hole transporting layer by moving through the electron transporting layer, the electrons reaching the interface enter the hole transporting layer if the difference between the LUMO level of the hole transporting material and the LUMO level of the host material is small. In such a case, electrons are not confined in the electron transporting layer and efficient recombination cannot be achieved. To avoid such a situation, it is desirable to set the difference between the LUMO levels of the hole transporting material and the electron transporting material which is a host material to a value large enough to block electrons. Preferably, this difference is 0.2 eV or greater.

More concrete examples of a method of fabricating the triplet light emitting device of the prevent invention and materials used in the device will next be described.

A device fabrication method of the present invention shown in FIG. 2 is performed as described below. First, a hole transporting material is deposited on a substrate with an anode (ITO). Next, an electron transporting material (host material) and a triplet light emitting material (dopant) are codeposited. Finally, a cathode is formed by deposition. The dopant concentration at the time of codeposition of the host material and the dopant material is adjusted to about 8 wt %. Finally, sealing is performed to complete the organic light emitting device.

Materials which can be suitably used as a hole injection material, a hole transporting material, an electron transporting material (host material), and a triplet light emitting material (dopant material) in the device of the present invention are shown below. However, materials usable in the device of the present invention are not limited to those shown below.

As the effective hole injecting material among organic compounds, there is a porphyrin-based compound, phthalocyanine (hereinafter referred to as "$H_2Pc$"), copper phthalocyanine (hereinafter referred to as "CuPc"), or the like. In addition, a material which has a smaller ionization potential than the hole transporting material to be used and a hole transporting function can also be used as the hole injecting material. There is also used a material obtained by chemically doping a conductive polymer compound, for example, polyaniline or polyethylene dioxythiophene (hereinafter referred to as "PEDOT") doped with sodium polystyrene sulfonate (hereinafter referred to as "PSS"). Alternatively, a polymer compound as an insulator is effective in flattening the anode, so that polyimide (hereinafter referred to as "PI") is widely used. Furthermore, there is also used such an inorganic compound as a metal thin film of gold, platinum, or the like or a microthin film of aluminum oxide (hereinafter referred to as "alumina").

As the effective hole transporting material, there is a material having an energy gap value larger than that of the electron transporting material to be used as the host material. Also, it is preferable that the material has a larger ionization potential than the light emitting material or the absolute value of LUMO thereof is smaller than that of the electron transporting material by 0.2 eV or more.

Examples of the hole transporting material having a large energy gap value which is preferable for the device of the present invention include: 4,4',4"-tris(N-carbazole)triphenylamine (hereinafter referred to as "TCTA") represented by the following structural formula 1; 1,3,5-tris[N,N-bis(2-methylphenyl)-amino]-benzene (hereinafter referred to as "o-MTDAB") represented by the following structural formula 2; 1,3,5-tris[N,N-bis(3-methylphenyl)-amino]-benzene (hereinafter referred to as "m-MTDAB") represented by the following structural formula 3; 1,3,5-tris[N,N-bis(4-methylphenyl)-amino]-benzene (hereinafter referred to as "p-MTDAB") represented by the following structural formula 4; and 4,4'-bis[N,N-bis(3-methylphenyl)-amino]-diphenylmethane (hereinafter referred to as "BPPM") represented by the following structural formula 5.

[Formula 1]

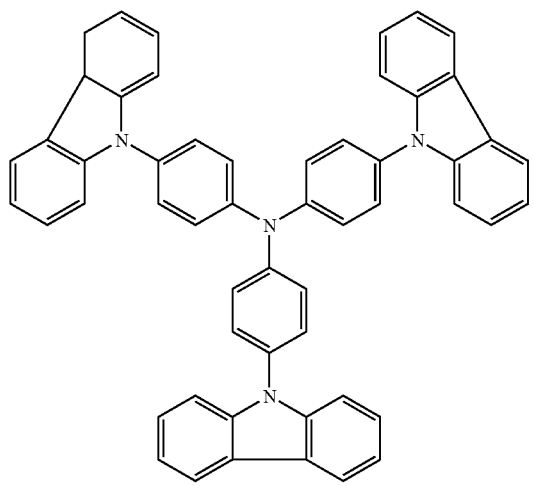

[Formula 2]

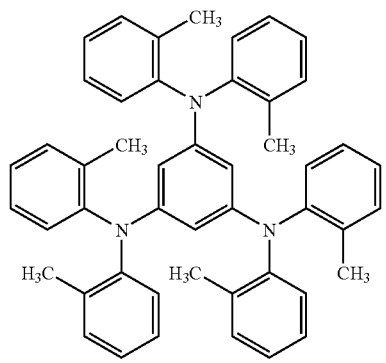

[Formula 3]

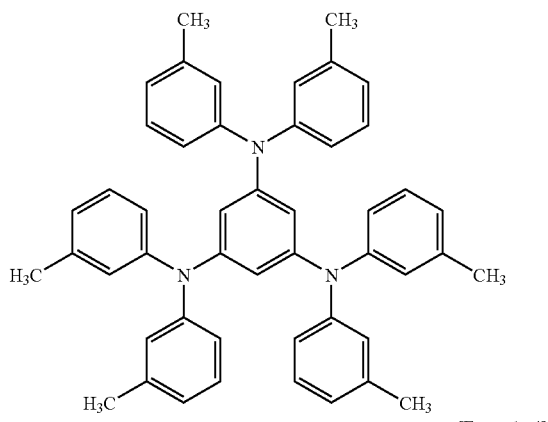

[Formula 4]

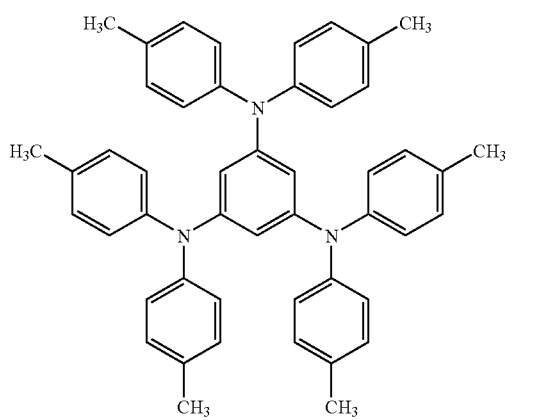

[Formula 5]

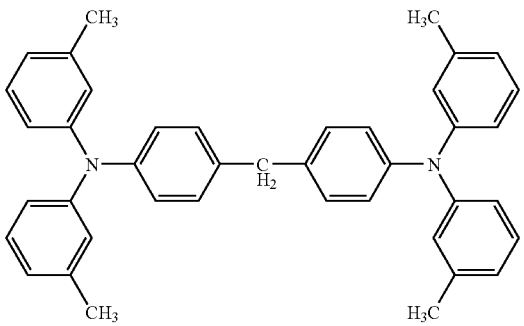

On the other hand, 4,4'-bis[N-(3-methylphenyl)-N-phenyl-amino]-biphenyl (hereinafter referred to as "TPD") which is an aromatic amine-based compound and used most widely and α-NPD as its derivative have smaller energy gap values than the compounds represented by the structural formulae 1 to 5, and are therefore difficult to use for the device of the present invention. Table 1 shows the energy gap values (actually measured values) of the compounds represented by the structural formulae 1 to 5, α-NPD, and TPD.

TABLE 1

| Material | Energy gap [eV] |
| --- | --- |
| TCTA | 3.3 |
| o-MTDAB | 3.6 |

TABLE 1-continued

| Material | Energy gap [eV] |
|---|---|
| m-MTDAB | 3.5 |
| p-MTDAB | 3.6 |
| BPPM | 3.6 |
| TPD | 3.1 |
| α-NPD | 3.1 |

A stable material is preferred as an electron transporting material used as a host. For example, a selection may be made from a number of metal complexes of high stability. Materials used as a host material must have an energy gap value larger than that of the triplet light emitting material, which is a dopant. Different host materials are selected according to the light emitting materials used. Examples of electron transporting materials usable as a host are shown below.

According to the present invention, as an example of a material that can be used as the host material with respect to a blue light emitting material, there is a material in which light emission spectrum can be seen at an extremely short wavelength as of ultraviolet region, for example, 2,2',2"-(1,3,5-benzenetrile)tris-[1-phenyl-1H-benzimidazole] (hereinafter referred to as "TPBI") represented by the following structural formula 6.

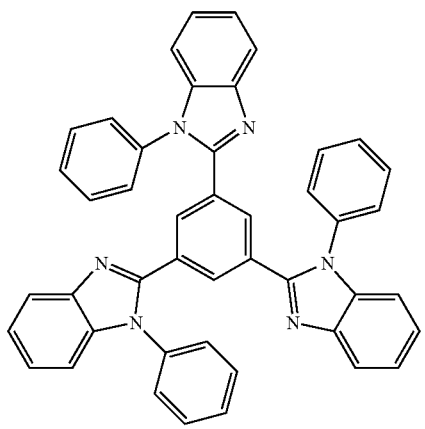

[Formula 6]

According to the present invention, examples of the host material with respect to the green light emitting material include: lithiumtetra(2-(2-hydroxyphenyl)benzooxazolato-boron (hereinafter referred to as "LiB(PBO)$_4$") represented by the following structural formula 7; bis(2-(2-hydroxyphenyl)benzooxazolato)(triphenylsilanolato)aluminum (hereinafter referred to as "SAlo") represented by the following structural formula 8; bis(2-(2-hydroxyphenyl)benzothiazolato)(triphenylsilanolato)aluminum (hereinafter referred to as "SAlt") represented by the following structural formula 9; 2-(2-hydroxyphenyl)benzooxazolatolithium (hereinafter referred to as "Li(PBO)") represented by the following structural formula 10; and (2-(2-hydroxyphenyl)benzooxazolato)-diphenylboron (hereinafter referred to as "B(PBO)Ph$_2$") represented by the following structural formula 11. In addition to these, it is possible to use as the host material the material that can emit blue light.

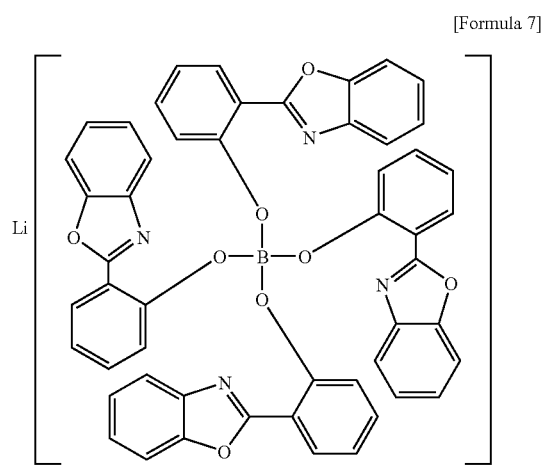

[Formula 7]

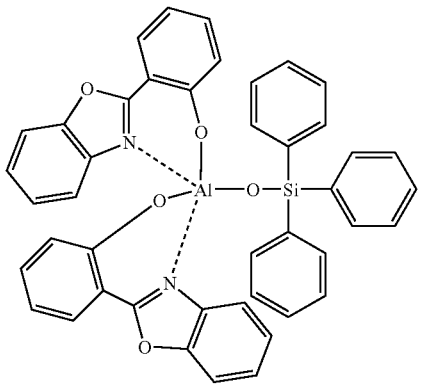

[Formula 8]

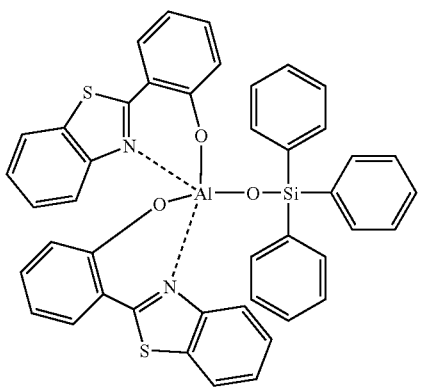

[Formula 9]

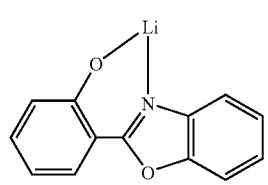

[Formula 10]

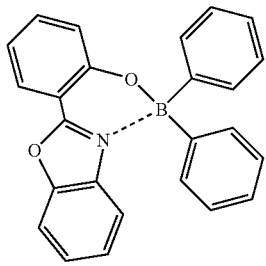

[Formula 11]

According to the present invention, examples of the host material with respect to the red light emitting material include: Alq represented by the following structural formula 12; bis(2-methyl-8-quinolinolato)(triphenylsilanolato)aluminum (hereinafter referred to as "SAlq") represented by the following structural formula 13; bis(2-methyl-8-quinolinolato)(4-phenylphenolato)aluminum (hereinafter referred to as "BAlq") represented by the following structural formula 14; lithiumtetra(2-methyl-8-hydroxy-quinolinato)boron (hereinafter referred to as "LiB(mq)$_4$") represented by the following structural formula 15; (2-methyl-8-quinolinolato)-diphenylboron (hereinafter referred to as "BmqPh") represented by the following structural formula 16; and bis(2-methyl-8-quinolinolato)aluminiumhydroxide (hereinafter referred to as "Almq$_2$(OH)") represented by the following structural formula 17. In addition to these, it is possible to use as the host material the material that can emit blue light or the material that can emit green light.

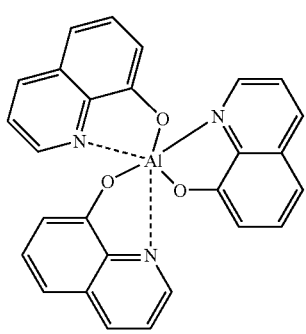

[Formula 12]

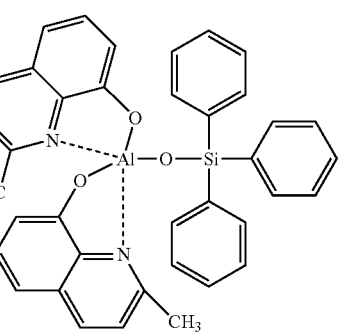

[Formula 13]

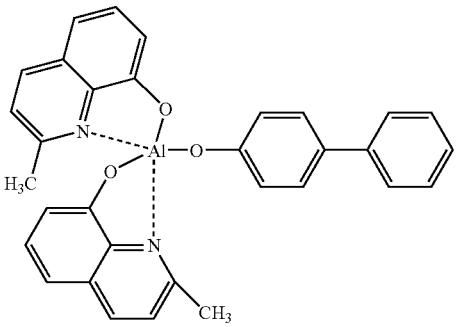

[Formula 14]

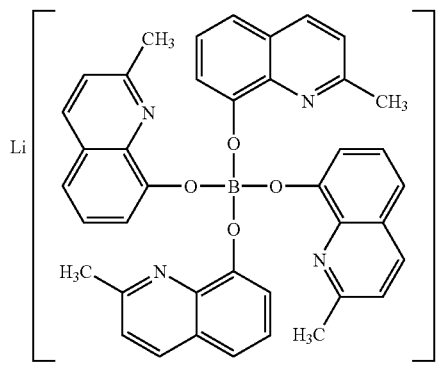

[Formula 15]

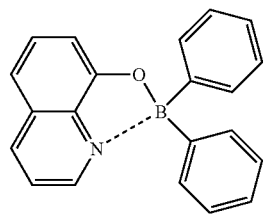

[Formula 16]

[Formula 17]

Note that the energy gap values (actually measured values) in accordance with some of the host materials described above are shown in Table 2.

TABLE 2

| Material | Energy gap [eV] |
|---|---|
| TPBI | 3.5 |
| LiB(PBO)$_4$ | 3.1 |
| SAlo | 3.2 |
| SAlt | 3.0 |
| Alq | 2.7 |
| SAlq | 3.0 |
| LiB(mq)$_4$ | 3.0 |

Examples of the triplet light emitting material as a dopant mostly include complexes having a central metal of iridium or platinum. However, any material may be adopted as long as it emits phosphorescence at a room temperature. As such a material, for example, there are PtOEP, Ir(ppy)$_3$, bis(2-phenylpyridinato-N,C$^{2'}$)acetylacetonatoiridium (hereinafter referred to as "acacIr(ppy)$_2$"), bis(2-(4'-trile)-pyridinato-N, C$^{2'}$)acetylacetonatoiridium (hereinafter referred to as "acacIr (tpy)$_2$"), and bis(2-(2'-benzothienyl)pyridinato-N,C$^{3'}$)acetylacetonatoiridium (hereinafter referred to as "acacIr(btp)$_2$").

Note that the energy gap values (actually measured values) in accordance with the dopant materials described above are shown in Table 3.

TABLE 3

| Material | Energy gap [eV] |
|---|---|
| Ir(ppy)$_3$ | 2.4 |
| acacIr(ppy)$_2$ | 2.4 |
| acacIr(tpy)$_2$ | 2.4 |
| acacIr(btp)$_2$ | 2.3 |

As the electron injecting material, the electron transporting material described above can be used. However, such an electron transporting material (BCP, OXD7, or the like) that is used as the hole blocking material is low in stability, and thus it is inappropriate as the electron injecting material. In addition, there is often used a microthin film made of an insulator, for example, alkali metal halide such as lithium fluoride or alkali metal oxide such as lithium oxide. Also, an alkali metal complex such as lithium acetylacetonate (hereinafter referred to as "Li(acac)") or 8-quinolinolato-lithium (hereinafter referred to as "Liq") is effective.

A combination of materials is selected from the above-described materials having the desired functions to be used in the organic light emitting device of the present invention. Thus, a high-efficiency organic light emitting device which can be fabricated by a simpler process in comparison with the conventional triplet light emitting devices, which has improved stability, and which has a light emission efficiency substantially equal to that of the conventional triplet light emitting devices can be provided.

Embodiments of the organic light emitting device of the present invention shown in FIG. 2 will be described below.

Embodiment 1

First, a 40 nm-thick layer of BPPM, which is a hole transporting material, is deposited on glass substrate 101 with ITO film formed as anode 102 and having a thickness of about 100 nm. Hole transporting layer 103 is thereby formed.

After fabrication of the hole transporting layer, acacIr(tpy)$_2$, which is a triplet light emitting material, and TPBI, which is an electron transporting material (host material), are codeposited in proportions of about 2:23 (weight ratio). That is, acacIr(tpy)$_2$ is dispersed at a concentration of about 8 wt % in TPBI. A 50 nm-thick codeposited film is thereby formed. This film is electron transporting and light emitting layer 104.

Finally, Mg and Ag are codeposited at an atomic ratio of 10:1 to form cathode 105. A 150 nm-thick film for cathode 205 is thereby formed. A triplet light emitting device which emits green light derived from acacIr(tpy)$_2$ is thus obtained.

FIGS. 5A to 5D are graphs showing an initial characteristic and a light emission spectrum in this device. Even though the simple two-layer structure was formed, a device characteristic of high efficiency, i.e., a maximum external quantum efficiency of about 10%, was exhibited.

Embodiment 2

A device in accordance with the present invention was fabricated by using a hole transporting material (satisfying the condition in accordance with the present invention) different from that in Embodiment 1.

First, a 40 nm-thick layer of o-MTDAB, which is a hole transporting material, is deposited on glass substrate 101 with ITO film formed as anode 102 and having a thickness of about 100 nm. Hole transporting layer 103 is thereby formed.

After fabrication of the hole transporting layer, acacIr(tpy)$_2$, which is a triplet light emitting material, and TPBI, which is an electron transporting material (host material), are codeposited in proportions of about 2:23 (weight ratio). That is, acacIr(tpy)$_2$ is dispersed at a concentration of about 8 wt % in TPBI. A 50 nm-thick codeposited film is thereby formed. This film is electron transporting and light emitting layer 104.

Finally, Mg and Ag are codeposited at an atomic ratio of 10:1 to form cathode 205. A 150 nm-thick film for cathode 205 is thereby formed. A triplet light emitting device which emits green light derived from acacIr(tpy)$_2$ is thus obtained.

FIGS. 6A to 6D are graphs showing an initial characteristic and a light emission spectrum of this device. A high-efficiency device can be fabricated as in Embodiment 1.

Embodiment 3

An organic light emitting device in accordance with the present invention was fabricated by using as a host material a hole transporting material (satisfying the condition in accordance with the present invention) different from that in Embodiment 1. The fabrication method is the same as that in Embodiments 1 and 2. BPPM is used as a hole transporting material, SAlt is used as a host, i.e., the electron transporting material, and acacIr(tpy)$_2$ is used as a dopant. A triplet light emitting device which emits green light derived from acacIr (tpy)$_2$ can be obtained.

FIGS. 7A to 7D show an initial characteristic and a light emission spectrum of this device. A high-efficiency device having a light emission efficiency substantially equal to that in the conventional triplet light emitting devices can be fabricated as in Embodiment 1 or 2.

Embodiment 4

By using a triplet light emitting material different from Embodiment 1, 2, or 3 as a dopant, an organic light emitting device having a light emission color different from that of Embodiment 1, 2, or 3 is prepared. The method for preparation is the same as that of Embodiments 1, 2, and 3. BPPM is used as the hole trarisporting material, TPBI is used as the electron transporting material, and bis(2-(2',4'-difluorophenyl)pyridinato-N,C2')picolatoiridium is used as the dopant. It is possible to obtain the triplet light emitting device which emits blue light derived from the dopant material.

FIGS. 8A to 8D show an initial characteristic and a light emission spectrum of this device. A high-efficiency device having a light emission efficiency substantially equal to that in the conventional triplet light emitting devices can be fabricated as in Embodiment 1, 2, or 3.

COMPARATIVE EXAMPLE 1

A device of a structure similar to that of the conventional triplet light emitting device shown in FIG. 12 was manufactured and its characteristics were compared with those of the devices of the present invention.

First, a 40 nm-thick layer of α-NPD, which is a hole transporting material, is deposited on glass substrate 1101 with ITO film formed as anode 1102 and having a thickness of about 100 nm. Hole transporting layer 1103 is thereby formed.

After fabrication of the hole transporting layer, acacIr(tpy)$_2$, which is a triplet light emitting material, and CBP, which is a host material, are codeposited in proportions of about 2:23 (weight ratio). That is, acacIr(tpy)$_2$ is dispersed at a concentration of about 8 wt % in CBP. A 50 nm-thick codeposited film is thereby formed. This film is light emitting layer 1104.

After the formation of the light emitting layer, a 20 nm-thick film of BCP, which is a hole blocking material, is deposited to form hole blocking layer 1105. A 30 nm-thick film of Alq, which is an electron transporting material is deposited to form electron transporting layer 1106.

Finally, Mg and Ag are codeposited at an atomic ratio of 10:1 to form cathode 1107. A 150 nm-thick film for cathode 1107 is thereby formed. A triplet light emitting device which emits green light derived from acacIr(tpy)$_2$ is thus obtained.

FIGS. 9A to 9D show an initial characteristic and a light emission spectrum of this device. From comparison between this comparative example and each of Embodiments 1, 2, and 3, it can be understood that the device of the present invention in each Embodiment has the same high efficiency as the conventional device. It was confirmed that sufficiently high device characteristics were exhibited even though no hole blocking layer was used.

COMPARATIVE EXAMPLE 2

In this comparative example, characteristics of a triplet light emitting device of a two-layer structure in which a hole transporting material not satisfying the device conditions in accordance with the present invention is used are examined.

The same fabrication method as that in the Embodiments of the present invention is used. However, a combination of a hole transporting material and a host material is used such that the energy gap value of the hole transporting material used is smaller than that of the host material. TPD is used as the hole transporting material, TPBI is used as the host material, which is an electron transporting material, and acacIr(tpy)$_2$ is used as a dopant.

FIGS. 10A to 10D show an initial characteristic and a light emission spectrum of this device. The device using TPD as a hole transporting material has a considerably low light emission efficiency for a triplet light emitting device. A spectral component (about 400 nm) corresponding to emission from TPD other than emission from acacIr(tpy)$_2$ is observed, as seen in the light emission spectrum. A reduction in efficiency results from this. Thus, the initial characteristic of the device is inferior if a material not satisfying the condition is used.

COMPARATIVE EXAMPLE 3

In this comparative example, characteristics of a triplet light emitting device of a two-layer structure in which a hole transporting material not satisfying the device conditions in accordance with the present invention is used as in Comparative Example 2 are examined.

The same fabrication method as that in the Embodiments of the present invention is used. However, a combination of a hole transporting material and a host material is used such that the energy gap value of the hole transporting material used is smaller than that of the host material. In this example, α-NPD is used as the hole transporting material, TPBI is used as the host material, which is an electron transporting material, and acacIr(tpy)$_2$ is used as a dopant.

FIGS. 11A to 11D show an initial characteristic and a light emission spectrum of this device. The device using α-NPD as a hole transporting material has a considerably low light emission efficiency for a triplet light emitting device, as in Comparative Example 2. A spectral component (about 440 nm) corresponding to emission from α-NPD which is a hole transporting material is observed, as in Comparative Example 2. A reduction in efficiency results from this. Thus, the initial characteristic of the device is inferior if a material not satisfying the condition is used.

If the present invention is carried out, a triplet light emitting device having a light emission efficiency substantially equal to that of the conventional triplet light emitting devices can be obtained in a simple device structure. Also, the layer in which an unstable material is used is removed to enable a stable organic light emitting device to be provided.

What is claimed is:

1. A method of manufacturing a light-emitting device comprising:
    forming an anode over a substrate;
    forming a hole transporting layer containing a hole transporting material over the anode;
    forming an electron transporting and light emitting layer by codepositing a triplet light emitting material comprising iridium (III) and an electron transporting material comprising a complex including 2-methyl-8-quinoline unit over the hole transporting layer; and
    forming a cathode over the electron transporting and light emitting layer,
    wherein an energy difference between a highest occupied molecular orbit level and a lowest unoccupied molecular orbit level in the hole transporting material is larger than that between a highest occupied molecular orbit level and a lowest unoccupied molecular orbit level in the electron transporting material.

2. A method of manufacturing a light-emitting device according to claim 1, wherein the anode comprises ITO.

3. A method of manufacturing a light-emitting device according to claim 1, wherein the cathode comprises Mg and Ag.

4. A method of manufacturing a light-emitting device according to claim 1, wherein an absorption spectrum of the hole transporting material and a light emission spectrum of the electron transporting material do not overlap each other.

5. A method of manufacturing a light-emitting device according to claim 1, wherein an absorption spectrum of the hole transporting material is on a shorter-wavelength side of a light emission spectrum of the electron transporting material.

6. A method of manufacturing a light-emitting device comprising:
    forming an anode over a substrate;
    forming a hole injection layer on the anode;
    forming a hole transporting layer containing a hole transporting material over the hole injection layer;
    forming an electron transporting and light emitting layer by codepositing a triplet light emitting material comprising iridium (III) and an electron transporting material comprising a complex including 2-methyl-8-quinoline unit over the hole transporting layer; and
    forming a cathode over the electron transporting and light emitting layer, wherein an energy difference between a highest occupied molecular orbit level and a lowest unoccupied molecular orbit level in the hole transporting material is larger than that between a highest occupied molecular orbit level and a lowest unoccupied molecular orbit level in the electron transporting material.

7. A method of manufacturing a light-emitting device according to claim 6, wherein the anode comprises ITO.

8. A method of manufacturing a light-emitting device according to claim 6, wherein the cathode comprises Mg and Ag.

9. A method of manufacturing a light-emitting device according to claim 6, wherein an absorption spectrum of the hole transporting material and a light emission spectrum of the electron transporting material do not overlap each other.

10. A method of manufacturing a light-emitting device according to claim 6, wherein an absorption spectrum of the hole transporting material is on a shorter-wavelength side of a light emission spectrum of the electron transporting material.

11. A method of manufacturing a light-emitting device comprising:
   forming an anode over a substrate;
   forming a hole transporting layer containing a hole transporting material over the anode;
   forming an electron transporting and light emitting layer by codepositing a triplet light emitting material comprising iridium (III) and an electron transporting material comprising a complex including 2-methyl-8-quinoline unit over the hole transporting layer;
   forming an electron injection layer over the electron transporting and light emitting layer; and
   forming a cathode on the electron injection layer,
   wherein an energy difference between a highest occupied molecular orbit level and a lowest unoccupied molecular orbit level in the hole transporting material is larger than that between a highest occupied molecular orbit level and a lowest unoccupied molecular orbit level in the electron transporting material.

12. A method of manufacturing a light-emitting device according to claim 11, wherein the anode comprises ITO.

13. A method of manufacturing a light-emitting device according to claim 11, wherein the cathode comprises Mg and Ag.

14. A method of manufacturing a light-emitting device according to claim 11, wherein an absorption spectrum of the hole transporting material and a light emission spectrum of the electron transporting material do not overlap each other.

15. A method of manufacturing a light-emitting device according to claim 11, wherein an absorption spectrum of the hole transporting material is on a shorter-wavelength side of a light emission spectrum of the electron transporting material.

16. A method of manufacturing a light-emitting device comprising:
   forming an anode over a substrate;
   forming a hole injection layer on the anode;
   forming a hole transporting layer containing a hole transporting material over the hole injection layer;
   forming an electron transporting and light emitting layer by codepositing a triplet light emitting material comprising iridium (III) and an electron transporting material comprising a complex including 2-methyl-8-quinoline unit over the hole transporting layer;
   forming an electron injection layer over the electron transporting and light emitting layer; and
   forming a cathode on the electron injection layer,
   wherein an energy difference between a highest occupied molecular orbit level and a lowest unoccupied molecular orbit level in the hole transporting material is larger than that between a highest occupied molecular orbit level and a lowest unoccupied molecular orbit level in the electron transporting material.

17. A method of manufacturing a light-emitting device according to claim 16, wherein the anode comprises ITO.

18. A method of manufacturing a light-emitting device according to claim 16, wherein the cathode comprises Mg and Ag.

19. A method of manufacturing a light-emitting device according to claim 16, wherein an absorption spectrum of the hole transporting material and a light emission spectrum of the electron transporting material do not overlap each other.

20. A method of manufacturing a light-emitting device according to claim 16, wherein an absorption spectrum of the hole transporting material is on a shorter-wavelength side of a light emission spectrum of the electron transporting material.

21. A method of manufacturing a light-emitting device according to claim 11, wherein said triplet light emitting material comprises a material selected from the group consisting of $Ir(ppy)_3$, $acacIr(ppy)_2$, $acacIr(tpy)_2$ and $acacIr(btp)_2$.

22. A method of manufacturing a light-emitting device according to claim 6, wherein said triplet light emitting material comprises a material selected from the group consisting of $Ir(ppy)_3$, $acacIr(ppy)_2$, $acacIr(tpy)_2$ and $acacIr(btp)_2$.

23. A method of manufacturing a light-emitting device according to claim 11, wherein said triplet light emitting material comprises a material selected from the group consisting of $Ir(ppy)_3$, $acacIr(ppy)_2$, $acacIr(tpy)_2$ and $acacIr(btp)_2$.

24. A method: of manufacturing a light-emitting device according to claim 16, wherein said triplet light emitting material comprises a material selected from the group consisting of $Ir(ppy)_3$, $acacIr(ppy)_2$, $acacIr(tpy)_2$ and $acacIr(btp)_2$.

* * * * *